(12) United States Patent
Yuferev et al.

(10) Patent No.: US 12,519,042 B2
(45) Date of Patent: Jan. 6, 2026

(54) METHODS FOR MANUFACTURING A SEMICONDUCTOR PACKAGE AND A SEMICONDUCTOR MODULE

(71) Applicant: Infineon Technologies Austria AG, Villach (AT)

(72) Inventors: Sergey Yuferev, Villach (AT); Josef Hoeglauer, Heimstetten (DE); Gerhard Noebauer, Villach (AT); Hao Zhuang, Hohenbrunn (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/629,215

(22) Filed: Apr. 8, 2024

(65) Prior Publication Data

US 2024/0258213 A1    Aug. 1, 2024

Related U.S. Application Data

(62) Division of application No. 17/471,249, filed on Sep. 10, 2021, now Pat. No. 11,978,692.

(30) Foreign Application Priority Data

Sep. 16, 2020  (EP) .................................... 20196531

(51) Int. Cl.
| | |
|---|---|
| *H01L 21/56* | (2006.01) |
| *H01L 23/495* | (2006.01) |
| *H01L 25/00* | (2006.01) |
| *H01L 25/07* | (2006.01) |

(52) U.S. Cl.
CPC ...... *H01L 23/49562* (2013.01); *H01L 21/561* (2013.01); *H01L 21/565* (2013.01); *H01L 23/49537* (2013.01); *H01L 23/49575* (2013.01); *H01L 25/071* (2013.01); *H01L 25/072* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 6,545,345 B1 | 4/2003 | Glenn et al. | |
| 8,686,554 B2 | 4/2014 | Standing | |
| 9,728,492 B1* | 8/2017 | See | H01L 21/7806 |
| 2004/0212057 A1 | 10/2004 | Otremba | |
| 2007/0096278 A1 | 5/2007 | Nakatsu et al. | |

(Continued)

*Primary Examiner* — Jay C Chang
(74) *Attorney, Agent, or Firm* — Murphy, Bilak & Homiller, PLLC

(57) ABSTRACT

A method for manufacturing a semiconductor package includes: providing a leadframe having component positions each of which includes a die pad; providing semiconductor dies each having a first power electrode on a first main surface and a second power electrode on a second main surface; mounting a respective semiconductor die onto the die pad of a respective component position of the leadframe such that the first power electrode is attached to the die pad; mounting a clip onto the dies such that the clip is attached to a respective second power electrode; embedding at least the side faces of the dies and inner surfaces of the leadframe and clip in a mold compound to form a subassembly; and cutting through the clip and leadframe at positions between neighbouring component positions.

19 Claims, 15 Drawing Sheets

(56) References Cited

U.S. PATENT DOCUMENTS

| | | |
|---|---|---|
| 2007/0096317 A1 | 5/2007 | Kiyohara |
| 2007/0138503 A1 | 6/2007 | Germain et al. |
| 2014/0353766 A1 | 12/2014 | Tan et al. |
| 2020/0203512 A1 | 6/2020 | Shirakawa |
| 2020/0266132 A1* | 8/2020 | Cho .................. H01L 23/49551 |

* cited by examiner

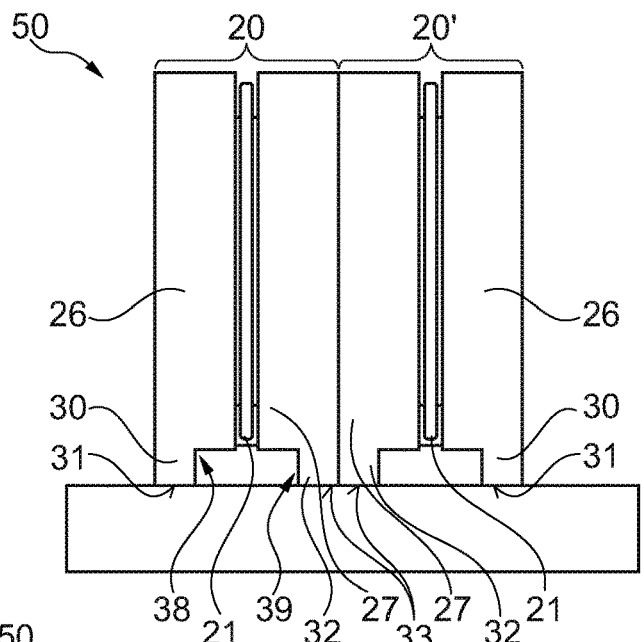
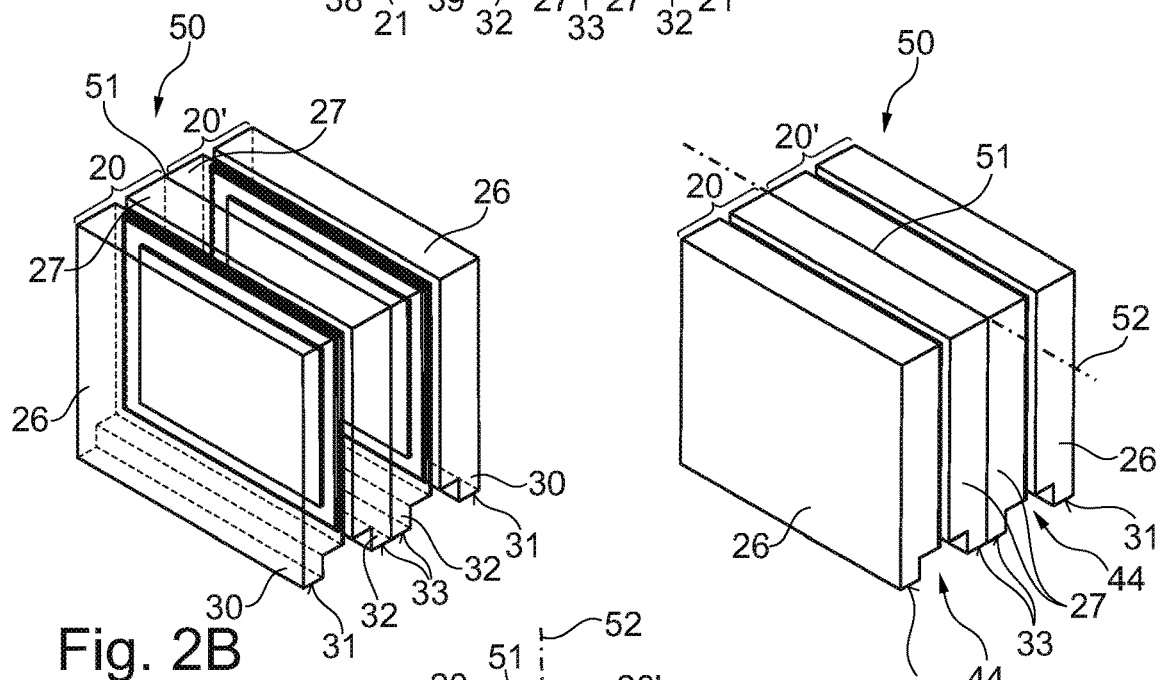
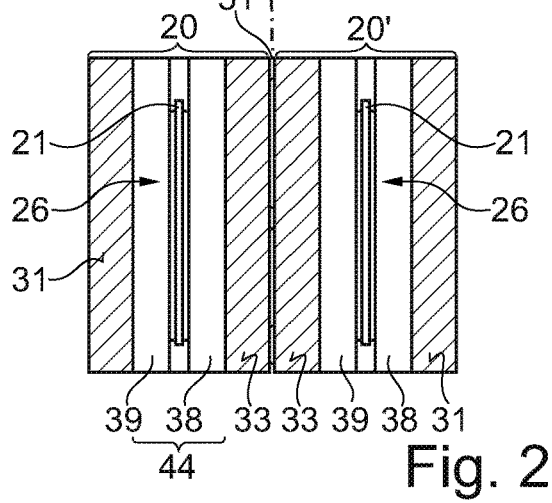

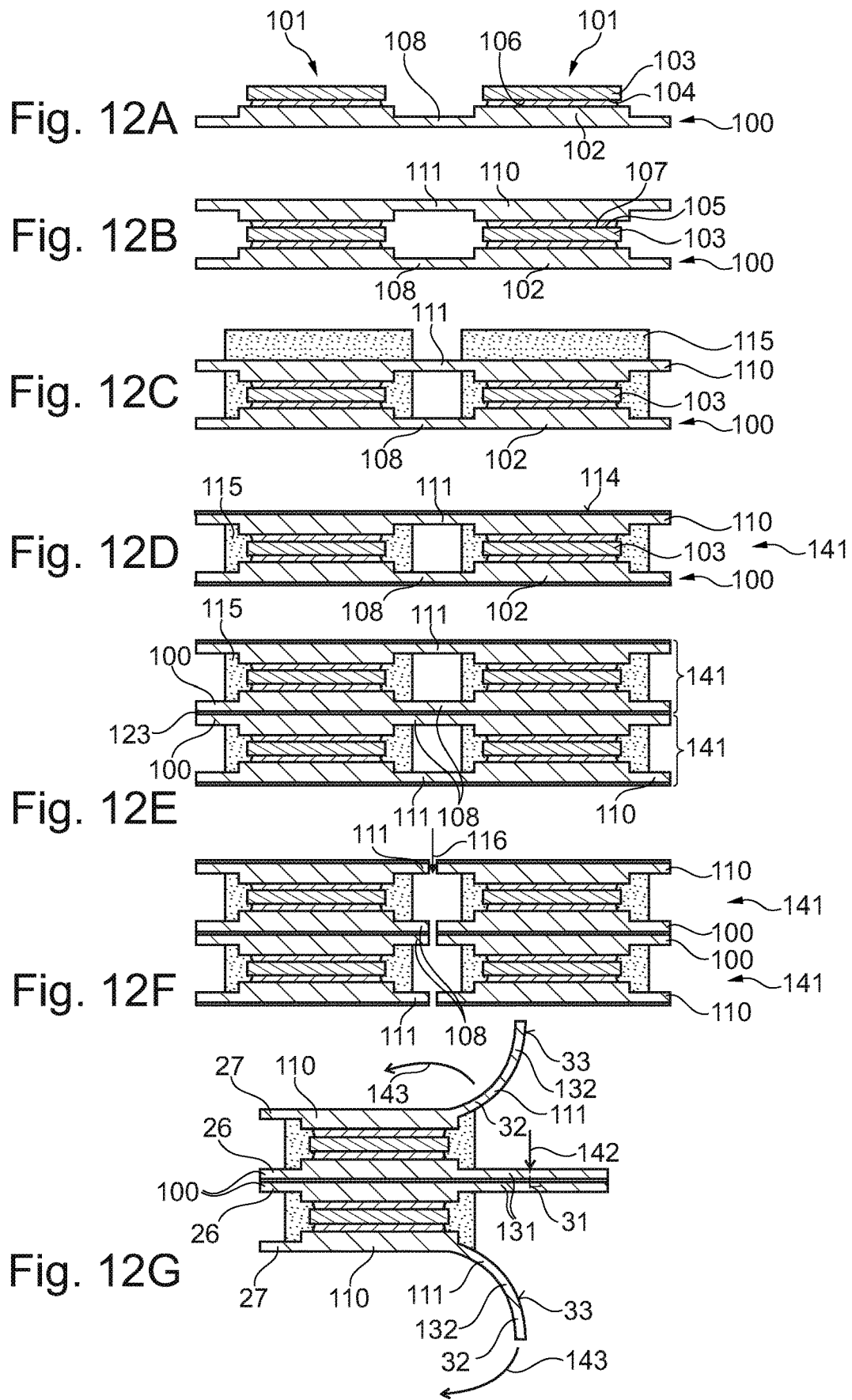

METHODS FOR MANUFACTURING A SEMICONDUCTOR PACKAGE AND A SEMICONDUCTOR MODULE

BACKGROUND

A semiconductor device is commonly provided in a semiconductor package having a substrate or a leadframe and a housing. The substrate or leadframe includes outer contacts which are used to mount the package on a redistribution board such as a printed circuit board. The semiconductor device is mounted on the substrate or leadframe and electrically connected to the substrate or leadframe by internal electrical connections, such as bond wires or solder. The housing may be formed of a plastic mold compound which covers the semiconductor device and the internal electrical connections.

The semiconductor device is formed in a semiconductor die or chip which commonly has opposing main surfaces each having a width and a breadth which are greater than the thickness of the die or chip. The package is typically mounted on a surface of the redistribution board such that the major surfaces of the semiconductor die are substantially parallel to the surface of the redistribution board. Consequently, the area occupied by the semiconductor package on the redistribution board is at least partially determined by the area of the main surfaces of the semiconductor die.

US 2007/0138503 A1 discloses a semiconductor package structure which includes a plurality of upright clips for vertically mounting the package to a higher level of assembly, for example, a redistribution board. The semiconductor die is arranged perpendicularly with respect to the horizontal surface of the board. This arrangement saves on horizontal board space, which allows for more components to be integrated onto the board of allows for a board that is smaller.

It is, however, desirable to further improve the reliability of a semiconductor package whilst keeping the horizontal space that the package occupies on the redistribution board small.

SUMMARY

According to the invention, a semiconductor package comprises a semiconductor die comprising opposing first and second main surfaces, a first power electrode on the first main surface and a second power electrode on the second main surface. The semiconductor package further comprises a first lead comprising an inner surface that is attached to the first power electrode of the semiconductor die and a distal end that comprises a first protruding side face that extends substantially perpendicularly to the first main surface of the semiconductor die. The semiconductor package further comprises a second lead comprising an inner surface that is attached to the second power electrode of the semiconductor die and a distal end that comprises a second protruding side face that extends substantially perpendicularly to the second main surface of the semiconductor die. The semiconductor package further comprises a mold compound enclosing at least part of the semiconductor die and at least part of the first and second leads. The first lead comprises a recess positioned in an edge of the inner surface and the second lead comprises a recess positioned in an edge of the inner surface.

A semiconductor package is provided in which the first and second protruding side faces provide first and second outer contact surfaces with which the semiconductor package can be mounted to substrate such as a redistribution board in a manner such that the first and second main surfaces of the semiconductor die and the first and second power electrodes are arranged substantially perpendicular to the surface of the redistribution board. The semiconductor package can be described as having a vertical arrangement. These first and second protruding side faces provide the first and second outer contact pads of the semiconductor package and are, consequently, exposed from the mold compound.

The distal ends of the first and second lead extend or protrude beyond the first and second main surfaces and beyond a side face of the semiconductor die that extends between the first and second main surfaces. The recess is positioned in an edge of the inner surface at the distal end of the respective lead. The recess in the edge of the inner surface of the first and second leads to an arrangement in which each of the first and second leads has a thickness adjacent the semiconductor die which is greater than the thickness of the distal end of the first and second lead, respectively.

The arrangement of the recess positioned in an edge of the inner surface of both the first and second leads forms a distal end to the respective lead that has a thickness which is less than the thickness of the portion of the lead attached to the first and second power electrode.

The first and second protruding side faces that extend substantially perpendicular to the first and second main surface of the semiconductor die have a width that is determined by the thickness of the protruding portion of the distal end. This width is less than the thickness of the lead at points adjacent the major surface of the semiconductor die. Therefore, the minimum distance between the first and second protruding side faces is greater than the thickness of the semiconductor die and also greater than the distance between the inner surfaces of the first and second leads at a position laterally adjacent the first and second power electrodes of the semiconductor die.

This design of the leads can be used to increase the reliability of the device. Firstly, the thickness of the leads at regions in which these are attached to the semiconductor die is greater so that the heat dissipation effect of the leads is increased. At the same time, the distance between the first and second protruding side faces that provide the outer contact areas or pads of the semiconductor device is increased so that the electrical isolation between the outer contact areas is increased and the creepage distance between the first and second protruding side faces to be increased which may be used to assist in improving the reliability of the package.

The inner surfaces of the leads and side faces of the semiconductor die are embedded in the mold compound. The mold compound may also be arranged between at least part of the recesses positioned in an edge of the inner surface of the first and second lead. This enables the electrical isolation between the outer contact surfaces provided by the first and second side faces to be increased to be increased which may be used to assist in improving the reliability of the package.

In some embodiments, the first lead is provided by a die pad of a leadframe and the second lead is provided by a conductive clip.

In some embodiments, the first lead is attached to the first power electrode of the semiconductor die by die attach material and the second lead is attached to the second power electrode by die attach material.

In some embodiments, the creepage distance between the first and second protruding side faces is greater than a total thickness of the semiconductor die and the die attach material.

The first and second leads each have an outer surface which opposes the respective inner surface of the lead. In some embodiments, the first and second protruding side faces of the first and second leads are arranged within a footprint of the semiconductor package that is defined by the mold compound and/or outer surfaces of the first and second leads. For example, one or both of the outer surfaces of the first and second leads may be exposed from the mold compound in order to provide an exposed metallic surface to improve the dissipation and an exposed metallic surface on which it is possible to attach a further heatsink or heat dissipate using solder. In these embodiments, the footprint of the semiconductor package is not greater than the area of the package defined by the mold compound, the outer surfaces and side faces of the first and second leads at positions in which they are attached to the main surfaces of semiconductor die. The semiconductor package may have a substantially cuboid shape.

In other embodiments, each of the first and second leads has an L-shape. The base of the L of the first and second leads extend in opposing directions such that the first and second protruding side faces extends laterally outside of the area of the semiconductor device package defined by the mold compound and/or outer surfaces of the first and second leads at positions laterally adjacent to the first and second main surfaces of the semiconductor die. This arrangement may be used to increase the area of the first and second protruding side faces which provide the outer contact surfaces of the package. This may be useful in reducing the contact resistance of the connection between the first and second protruding side face and the redistribution board and/or increasing the mechanical stability of the semiconductor package in its vertically mounted state.

In some embodiments, the first and second protruding side faces further comprise a solderable layer. The solderable layer may be used to provide better wetting of solder that that achievable using the material of the lead. For example, if the first and second lead are formed from copper or a copper alloy, the solderable layer may comprise one or more of titanium, nickel and silver.

In some embodiments, the semiconductor die comprises a diode and the first power electrode is an anode and the second power electrode is a cathode.

In some embodiments, the semiconductor die comprises a transistor device. In these embodiments, the first power electrode is a source electrode and the second power electrode is a drain electrode. The semiconductor die further comprises a gate electrode on the first main surface. Consequently, the semiconductor package further comprises a third lead having an inner surface attached to the gate electrode. The third lead also has a distal end comprising a third protruding side face that provides a third outer contact surface, the protruding third protruding side face extending substantially perpendicular to the first main surface of the semiconductor die.

The third lead is arranged in a common plane with the first lead whereby the common plane extends substantially parallel to the first main surface. The first and second leads can, therefore, be considered to be arranged in a row that so that the first and third protruding side faces are arranged in a row which extends substantially parallel to the second protruding side face.

In some embodiments, the third lead is positioned laterally adjacent the first lead such that the third protruding side face is arranged in a corner of the footprint of the semiconductor device.

In some embodiments, the first lead is U-shaped and the third lead is surrounded on three sides by the first lead. In these embodiments, the footprint includes a first protruding side face which is split into two portions, with the third protruding side face being arranged between and spaced apart from the two portions. The two portions and the third protruding side face are arranged in a row and in a common plane that extends substantially parallel to the first main surface of the semiconductor die.

The side faces of the semiconductor die and at least portions of the recess of the first lead, the recess of the second lead and the recess of the third lead, if present, are embedded in the mold compound. The outer surfaces of one or both of the first and second leads are at least partially exposed from the mold compound or may be entirely covered by the mold compound. For example, for a transistor device, the second lead which is connected to the drain electrode may be entirely covered by the mold compound and the first lead which is connected to the source electrode may be at least partially exposed from the mold compound. The third lead which is connected to the gate electrode may be entirely covered by the mold compound.

According to the invention, a semiconductor module is provided which includes two or more semiconductor dies. The semiconductor module may comprise two or more subassemblies, each subassembly comprising the semiconductor package of any one of the embodiments described herein. In some embodiments, the semiconductor module includes a single pair of subassemblies. The semiconductor dies of the two subassemblies are electrically coupled. In some embodiments, the semiconductor dies of the two subassemblies are electrically coupled in parallel.

In some embodiments, the two subassemblies have a mirror symmetrical arrangement about a centre plane of the semiconductor module that extends parallel to the first and second main surfaces of the respective semiconductor die. This embodiment may be used for two subassemblies each including a transistor device, for example, in order to enable the first lead, which is coupled to the source electrode and the third lead, which is coupled to the gate electrode, of each of the two subassemblies to be electrically connected by facing towards one another. In this arrangement, the first and third leads are arranged at the centre of the semiconductor module and the second leads of the two subassemblies are arranged at opposing sides of the semiconductor module and substantially equidistant from the centre plane of the semiconductor module. Consequently, the first outer contact pads are arranged in the centre plane of the semiconductor module and the second outer contact pads are arranged on opposing sides of the centre plane. In embodiments in which the semiconductor die is a transistor device, the third outer contact pads are arranged in the centre plane of the semiconductor module in a row with the first outer contact pads.

The first lead of the first subassembly may be electrically connected to the first lead of the second subassembly by an electrically conductive adhesive or by solder and, if present, the third lead of the first assembly is electrically connected to the third lead of the second subassembly by electrically conductive adhesive or by solder.

According to the invention, a method for manufacturing a semiconductor package is provided. The method comprises providing a leadframe comprising a plurality of component positions, each component position comprising a die pad, providing a plurality of semiconductor dies, each comprising opposing first and second main surfaces and side faces extending between and substantially perpendicularly to the first and second main surfaces, a first power electrode on the first main surface and a second power electrode on the second main surface. The method further comprises mounting a respective semiconductor die onto a die pad of a respective component position of the leadframe such that the first power electrode is attached to the die pad, mounting a clip onto the semiconductor dies such that the clip is attached to a respective second power electrode, applying a mold compound and embedding at least the side faces of the semiconductor dies and inner surfaces of the leadframe and the clip in the mold compound to form a subassembly and cutting through the clip and the leadframe at positions between neighbouring component positions thereby exposing surfaces of the die pad and the clip that extend substantially perpendicularly to the first main surface of the semiconductor die to form first and second outer contact surfaces of the semiconductor packages.

The clip may be provided in the form of separate individual clips that are arranged individually in each composition position. In some embodiments, a strip including a plurality of clips held together in the strip by tabs and/or connection portions may be provided. The strip is applied to the semiconductor dies such that one clip is mounted on the semiconductor die in each respective composition component.

In some embodiments, the plurality of clips may be provided in the form of a further leadframe.

In some embodiments, the clip, the mold compound and the leadframe are cut through at positions between neighbouring component positions such that the semiconductor packages are completely singulated from the subassembly.

In some embodiments, the clip and the mold compound is cut through between neighbouring component positions and completely separated from one another and the leadframe is partially singulated. Thus, an intermediate product is formed in which neighbouring component positions are held together in the subassembly by the remaining uncut part of the leadframe. This embodiment may be used to manufacture a module including two or more subassemblies as the leadframes of the two subassemblies can be stacked to form an arrangement including a plurality of composition positions, each including a stack of semiconductor dies.

In some embodiments, for example if the clip is provided in the form of a strip, the clip and the mold compound are cut through between neighbouring component positions such that the strip and/or regions of the mold compound at the periphery of the arrangement are uncut or partially singulated and the leadframe is partially singulated. Thus, an intermediate product is formed in which neighbouring component positions are held together in the subassembly by the remaining uncut part of the leadframe and by the remaining uncut part of the strip and the mold compound. This embodiment may also be used to manufacture a module including two or more subassemblies by stacking the leadframes of the two subassemblies.

In some embodiments, the cutting through the first and second leadframes at positions between neighbouring component positions comprises selectively singulating portions of the die pad and the clip to form the first and second outer contact pads, applying a solderable coating to the first and second outer pads of the die pad and the clip and then singulating the remaining portions of the leadframe to form a plurality of semiconductor packages from the subassembly.

In some embodiments, the semiconductor die comprises a transistor device, the first power electrode is a source electrode, the second power electrode is a drain electrode and the semiconductor die further comprises a gate electrode on the first main surface. The leadframe further comprises a gate lead in each component position, and the method further comprises attaching the gate electrode of the semiconductor die to the gate lead.

In some embodiments, two subassemblies are formed and an outer surface of the second clip of the two subassemblies is embedded in the mold compound and an outer surface of the leadframe of the two subassemblies is exposed from the mold compound. The exposed outer surfaces of the leadframes of the two subassemblies are stacked so that the die pads of the leadframes of the two subassemblies are attached to one another. Afterwards the clips and the leadframes of the two stacked subassemblies are cut through at positions between neighbouring component positions thereby exposing surfaces of the die pad and the clip of the two stacked subassemblies to form the first and second outer contact pads.

In some embodiments, two subassemblies are formed and an outer surface of the clip of the two subassemblies is embedded in the mold compound and an outer surface of the leadframe of the two subassemblies is exposed from the mold compound.

In some embodiments, the order of the method is changed such that after cutting through the clip and the leadframe of the two stacked subassemblies at positions between neighbouring component positions and exposing surfaces of the die pad and the clip to form first and second outer contact surfaces, the exposed outer surfaces of the leadframes of the two subassemblies, which are at most partially singulated, are stacked so that the die pads of the leadframes of the two subassemblies are attached to one another. A semiconductor module can be singulated from the stack by completing the cut along the singulating lines between the component positions through the stacked leadframes.

In some embodiments, the leadframes of two subassemblies are stacked such that in each component position the die pads of the two subassemblies are electrically connected to one another and the two semiconductor dies are electrically coupled in parallel.

In some embodiments, two individual singulated packages may be stacked and electrically connected to form a module.

In some embodiments, the first and second subassemblies of the stack have a mirror symmetrical arrangement about a centre plane of the subassembly that extends parallel to the first and second main surfaces of the semiconductor die.

In some embodiments, the method further comprises removing mold compound from the outer surface of the clip or strip or further leadframe including a plurality of clips. The mold compound may be removed by grinding.

In some embodiments for fabricating a semiconductor package, the method further comprising bending a distal end of the die pad and a distal end of the clip away from the semiconductor die to form L-shaped first and second clips.

In some embodiments for fabricating a semiconductor module, the method further comprising bending a distal end of the clip of the first subassembly and a distal clip of the second subassembly away from the centre plane to form L-shaped first and second clips.

In some embodiments, the die pad comprises an inner surface that is attached to the first power electrode of the semiconductor die and an outer surface that opposes the inner surface. A recess is positioned in an edge of the inner surface to space the protruding side face apart from the first main surface of the semiconductor die. The clip comprises an inner surface that is attached to the second power electrode of the semiconductor die and an outer surface that opposes the inner surface. A recess is positioned in an edge of the inner surface to space the protruding side face apart from the second main surface of the semiconductor die. At least portions of the recess of the die pad and at least portions of the recess of the clip are embedded in the mold compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 2A to 2D illustrate a semiconductor module according to an embodiment.

FIGS. 12A to 12G illustrate a method for fabricating a semiconductor module according to an embodiment.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
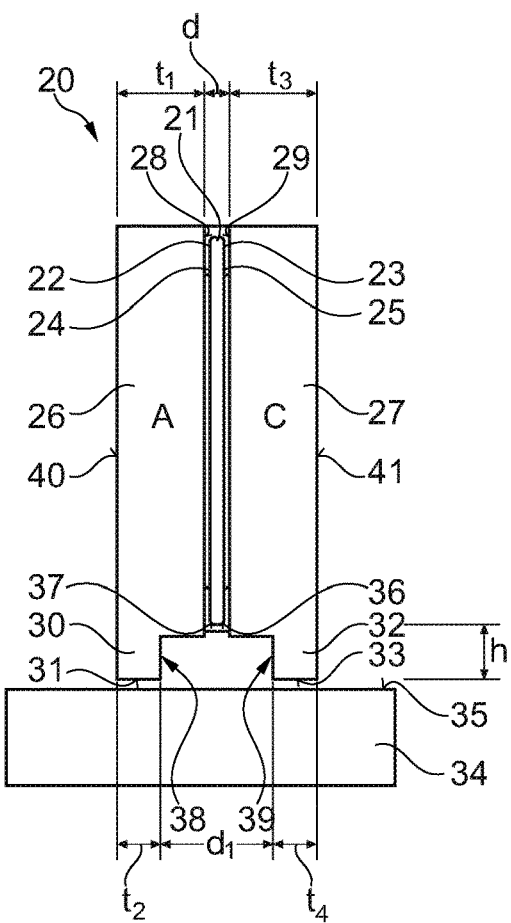
FIGS. 1A to 1D illustrate a semiconductor package according to an embodiment.

FIGS. 1A to 1D illustrate a semiconductor package 20 according to an embodiment. FIG. 1A illustrates a side view, FIG. 1B a partially transparent perspective view, FIG. 1C a perspective view and FIG. 1D a further perspective view of the lower surface of the semiconductor package 20.

The semiconductor package 20 includes a semiconductor die 21 comprising a first main surface 22 and a second main surface 23 which opposes the first main surface 22. A first power electrode 24 is arranged on the first main surface and a second power electrode 25 is arranged on the second main surface 23.

The semiconductor package 20 also includes a first lead 26 and a second lead 27 which are arranged on opposing sides of the semiconductor die 21 such that an inner surface 28 of the first lead 26 is attached to and electrically connected with the first power electrode 24 of the semiconductor die 21 and an inner surface 29 of the second lead 27 is attached to and electrically connected with the second power electrode 25 of the semiconductor die 21. The first lead 26 includes a distal end 30 that comprises a first protruding side face 31 which extends substantially perpendicularly to the first main surface 22 semiconductor die 21. The second lead 27 also has a distal end 32 that comprises a second protruding side face 33 that extend substantially perpendicularly to the second main surface 23 of the semiconductor die 21.

The first and second protruding side faces 31, 33 are substantially coplanar to one another and each provides an outer contact pad of the semiconductor package 20 with which the semiconductor package 20 can be mounted on a redistribution board 34. The first and second main surfaces 22, 23 of the semiconductor die 21 are therefore arranged substantially perpendicularly to the main surface 35 of the redistribution board 34 so that the semiconductor package 20 can be considered to have a vertical mounted arrangement.

The semiconductor package 20 further includes a mold compound 36 which encloses at least part of the semiconductor die 20 and at least part of the first and second leads 26, 27. For example, the inner surfaces 28, 29 of the first and second leads 26, 27 as well the semiconductor die 20 may be embedded within the mold compound 36. The first and second protruding side faces 31, 33 remain exposed from the mold compound 36 in order to provide the outer contact pads which are accessible external to the semiconductor package 20.

In some embodiments, the semiconductor die 21 is a diode such that the first power electrode 24 provides an anode electrode (A) and the second diode electrode power electrode 25 provides a cathode electrode (C) of the diode.

The distal end 30 of the first lead 26 and the distal end 32 of the second lead 27 protrude beyond the first and second main surfaces 22, 23, respectively, and beyond a side face 37 of the semiconductor die 20, the side face 37 extending substantially perpendicularly between the first and second main surfaces 22, 23 of the semiconductor die. The protruding side faces 31, 33 of the respective leads 26, 27, therefore, extend substantially parallel to the side face 37 of the semiconductor die 21 such that the side face 37 is spaced apart from the first and second protruding side faces 31, 33 of the leads 26, 27 by a distance h. Consequently, the side face 37 of the semiconductor die 21 faces towards and is spaced apart from the main surface 35 of the redistribution board 34.

The first lead 26 includes a recess 38 which is positioned in an edge of the inner surface 28 of the first lead 26 in particular in an edge of the inner surface 28 which is positioned at the distal end 30 of the first lead 26. The distal end 30 therefore has a thickness $t_2$ which is less than the thickness $t_1$ of the first lead 26 in the portion that is attached to the first main surface 22 of the semiconductor die 21 and, therefore, at positions laterally adjacent to the first main surface 22 of the semiconductor die 21. The second lead 27 also has a recess 39 positioned in an inner edge 29 of the distal end 32 so the distal end 32 also has a thickness $t_4$ which is less than the thickness $t_3$ of the second lead 27 in the portion that is attached to the second main surface 23 of the semiconductor die and, therefore, at positions laterally adjacent to the second main surface 23. The first and second protruding side faces 31, 33 are formed by the distal portions 30, 32 and each therefore have a width which corresponds to the thickness $t_2$, $t_4$.

Figure 1B:
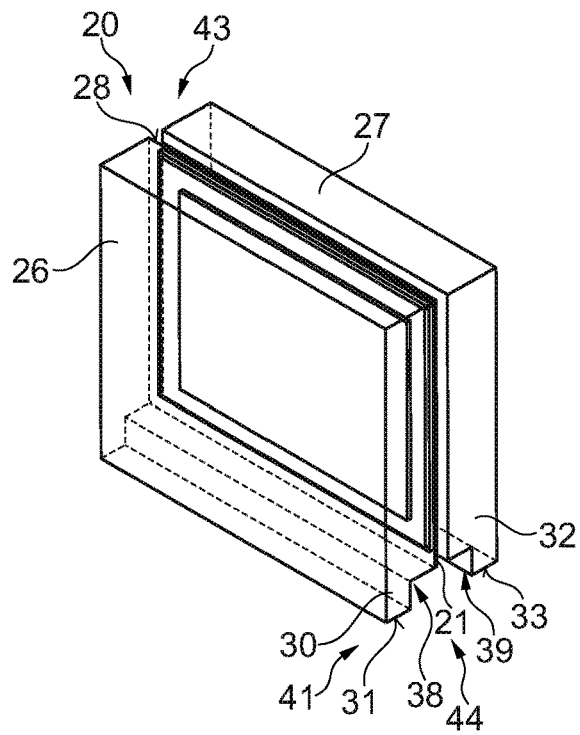
Figure 1C:
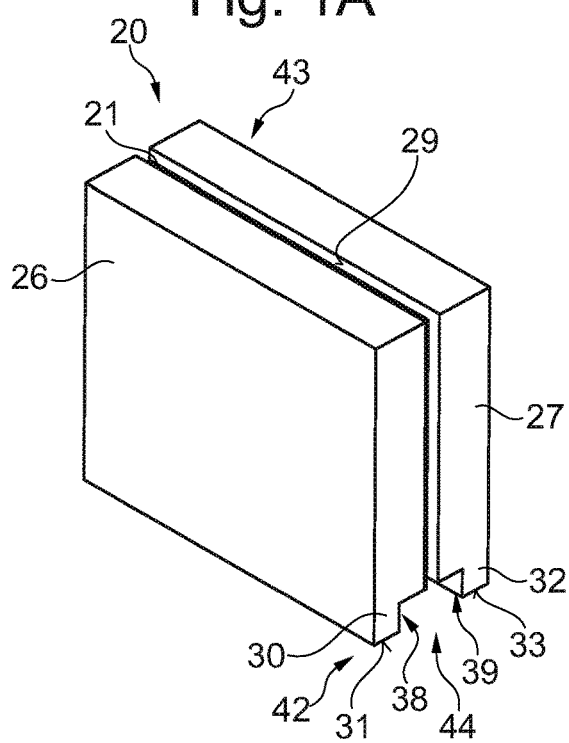
Figure 1D:
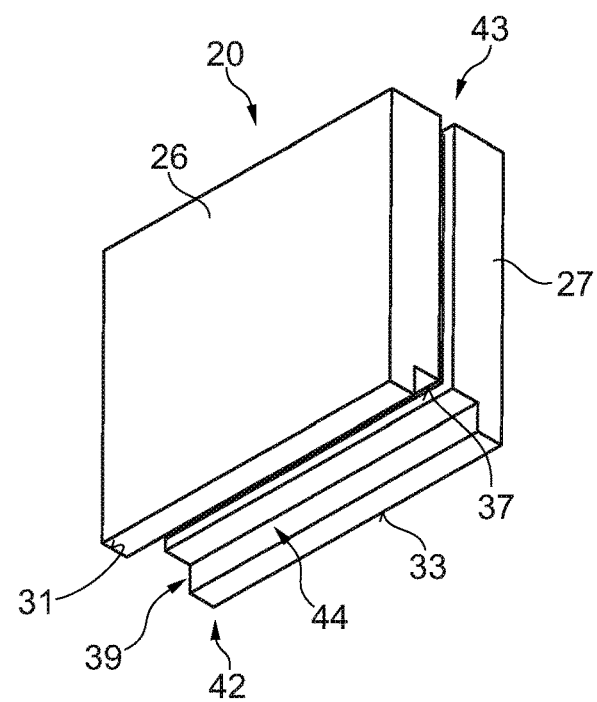

As can be seen in the perspective views of FIGS. 1B, 1C and 1D, the recesses 38, 39 together form a slot 44 in the lower side of the package 20. The mold compound 36 can be arranged in at least part of this slot 44.

This arrangement of the recesses 38, 39 and the form of the protruding distal ends 30, 32 of the first and second leads 26, 27 provides a semiconductor package 20 in which the distance $d_1$ between the first and second protruding side faces 31, 33, which provide the first and second outer contact pads of the semiconductor package 20, is greater than the distance d between the inner surfaces 28, 29 of the first and second leads 26, 27 at positions on which they are mounted on the first power electrode 24 and the second power electrode 25, respectively.

The inner surface 28 of the first lead 26 may be mounted on the first power electrode 24 and electrically connected to the first power electrode 24 using a die attach material which has a certain thickness. Similarly, the inner surface 29 of the second lead 27 may be mounted on a laterally connected to the second power electrode 25 by die attach material having a certain thickness. The distance $d_1$ between the first protruding side face 31 and the second protruding side face 33 is greater than the total thickness of the die attach material and semiconductor die 21. This arrangement of the distal ends 30, 32 of the first and second leads 26, 27 increases the spacing between the outer contact pads of the package 20, thus increasing the electrical isolation between the outer contact pads and the creepage distance. The creepage distance is the shortest possible distance over a surface between two conductive parts. These factors in turn assist in improving the reliability of the package.

Each of the leads 26, 27 includes an outer surface 40, 41. The outer surface 40 of the first lead 26 extends substantially parallel to the inner surface 28 at the portion of the lead 26 that is attached to the first power electrode 24 and substantially parallel to the first main surface 22 of the semiconductor die 21. Similarly, the outer surface 41 of the second lead 27 extends substantially parallel to the inner surface 29 at the portion of the lead 27 that is attached to the second power electrode 25 and substantially parallel to the second main surface 23 of the semiconductor die 21. In this embodiment, the outer surfaces 40, 41 are substantially planar throughout the height of the lead, i.e. also in the respective distal portion 30, 32 such that the lower side 42 of the semiconductor package 20 has approximately the same area as the upper side 43 of the semiconductor package 20. The semiconductor package 20 is substantially cuboid in shape. This is useful for providing a semiconductor package 20 which in takes up less area, i.e. horizontal space, on the main surface 35 of the redistribution board 34.

As can be seen in the views of FIGS. 1B and 1C, each of the first and second leads 26, 27 has a substantially cuboid form with the recesses 38, 39 being formed along the entire length of one edge of the cuboid to form the distal end 30, 32. The tow recess 38, 39 face towards one another to form a slot 44 in the lower side 42 of the package 20 that extends along the entire length of the centre of the lower side 42 of the semiconductor package 20. The height of the leads 26 is greater than the height of the semiconductor die 21 such that the distal ends 30,32 protrude over the side edge 37 of the semiconductor die 21 by a distance h. The first and second lead 26, 27 may also be laterally slightly larger than the first and second main surfaces 22, 23 of the semiconductor die 21 such that the side faces 37 of the semiconductor die 21 can be embedded in the mold material 36 and all of the outer surfaces of the first and second lead 26, 27 can remain uncovered by the mold material 36.

One of the first and second leads 26, 27 may be provided by a die pad of leadframe and the other one of the first and second leads 26, 27 may be provided by a conductive clip. In some embodiments, both of the first and second leads 26, 27 are provided by a die pad of a leadframe or by a conductive clip. The leads 26, 27 may be formed of copper or a copper alloy.

FIGS. 2A to 2D illustrate a semiconductor module 50, whereby FIG. 2A illustrates a cross-sectional view, FIG. 2B a partially transparent perspective view, FIG. 2C a perspective view and FIG. 2D a plan view of the footprint of the semiconductor module 50.

The semiconductor module 50 includes two semiconductor packages 20, 20' as described with reference to FIGS. 1A to 1D. In the following each of the semiconductor packages 20, 20' will be referred to as a subassembly as it represents a portion of the semiconductor module 50 rather than a finished semiconductor package. The semiconductor module 50 therefore includes two semiconductor dies 21.

The second lead 27 of the first subassembly 20, which is electrically connected to the second power electrode 25, is attached and electrically connected to the second lead 27 of the second subassembly 20' which is electrically connected to the second power electrode 25. This may be conveniently done by attaching the outer surfaces 41 of the second leads 27 of the two subassemblies 20 to one another, for example using solder 51, in a stacked arrangement.

The two subassemblies 20, 20' are attached to one another so that the semiconductor dies 21 are electrically coupled in parallel. In some embodiments, the semiconductor die 21 includes a diode so that the module 50 includes two diodes coupled in parallel.

The two subassemblies 20 are aligned such that the second protruding side faces 33 of the second leads 27 are substantially coplanar and form a common outer contact of the semiconductor module 50 at a centre plane 52 of the semiconductor module 50. The centre plane 52 extends perpendicularly to the lower surface and parallel to the main surface 22,23 of the semiconductor dies 21. The first protruding side faces 31 of the first leads 26 are positioned on opposing sides of the centre plane 51 of the semiconductor module 50. The first protruding side faces 31 are also coplanar with the second protruding side faces 33 and provide a symmetrical footprint for the semiconductor module 50 about the centre plane 52, as is illustrated in FIG. 2D.

Figure 3A:
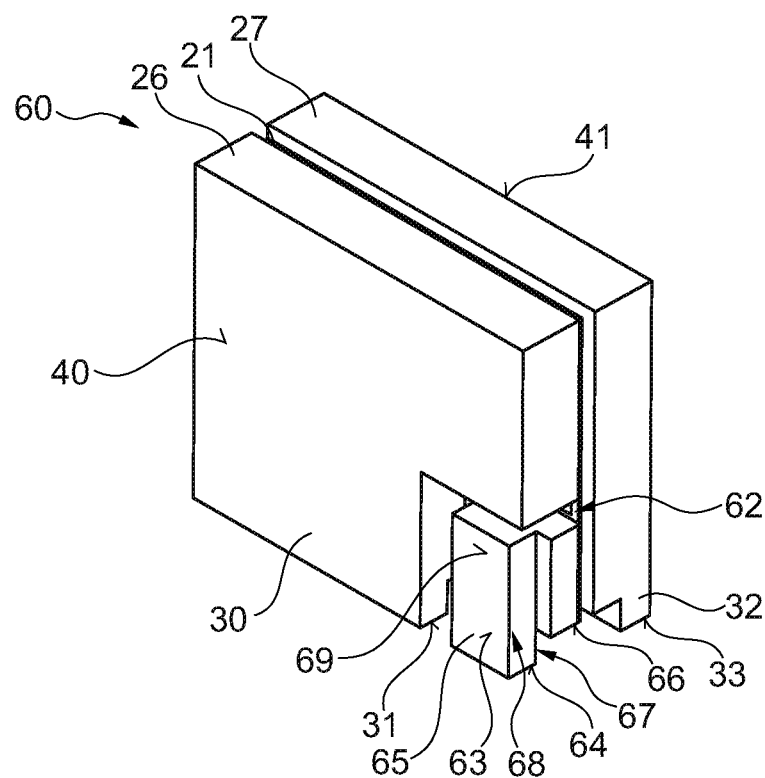
FIGS. 3A and 3B illustrate a semiconductor package according to an embodiment.
Figure 3B:
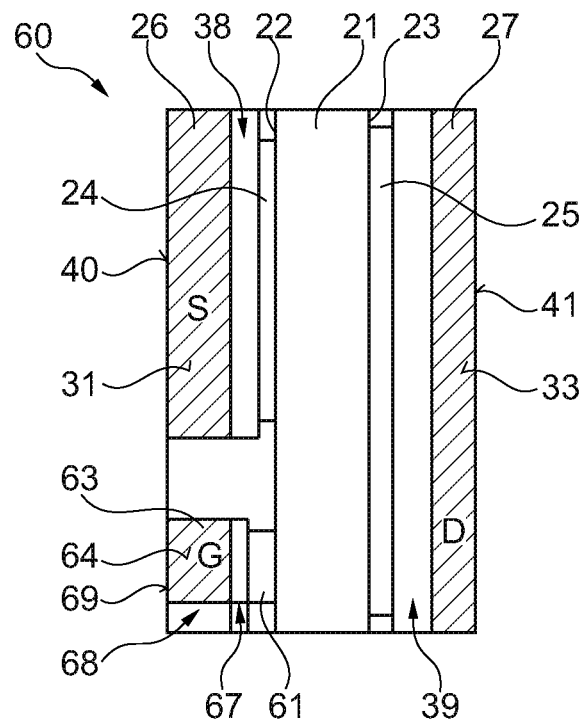

FIGS. 3A and 3B illustrate a semiconductor package 60 including a single semiconductor die 21, whereby FIG. 3A illustrates a perspective view and FIG. 3B a plan view illustrating the footprint of the semiconductor package 60. In contrast to the semiconductor package illustrated in FIGS. 1A-1D and 2A-2D, which is illustrated for a semiconductor die 21 comprising a diode, the semiconductor die 21 of the semiconductor package 60 includes a transistor device. The semiconductor die 21 includes a first power electrode 24 and a gate electrode 61 positioned on the first main surface 22 and a second power electrode 25 arranged on the opposing second main surface 23. The first power electrode 24 may be a source electrode and the second power electrode 25 a drain electrode or their functional equivalents.

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

The second lead 27 is arranged on and electrically connected to the second power electrode 25 and the first lead 26 is arranged on and electrically connected to the first power electrode 24. Each of the leads 26, 27 includes a distal end 30, 32 which includes a recess 38, 39 in an inner edge in order to provide a protruding distal end 30, 32 having a protruding side face 31, 33. The protruding side faces 31, 33 each provide an outer contact pad of the semiconductor package 60 that extend substantially perpendicularly to the first and second main surfaces 22, 23 of the semiconductor die 21 and which are spaced at a distance from the side face 37 of the semiconductor die 21.

The first lead 26 of the semiconductor package 60 differs in its shape from the first lead 26 of the semiconductor package 20 and can be considered to have an L-shaped form with a cutout 62 in one corner that encompasses the distal end 30 to form the L-shape. The gate electrode 61 on the first main surface 22 of the semiconductor die 21 is arranged in the cutout 62 and remains uncovered by the first lead 26. In the embodiment illustrated in FIGS. 6A and 6B, the gate electrode 61 is positioned in a corner of the first main surface 22 of the semiconductor die at a position which faces towards the bottom side and footprint of the semiconductor module 60. The first lead 26, therefore, includes a cutout 62 which leaves the corner of the first main surface 22 of the semiconductor die 21 uncovered.

The semiconductor module 60 further includes a gate lead 63 which is attached and electrically connected to the gate electrode 61. The gate lead 63 is positioned in the cutout 62 of the first lead 26 and has a size and shape such that it is spaced apart from side faces of the cutout 62 of the first lead 26. The gate lead 63 is also shaped it has a distal end 65 with a protruding side face 64 which is substantially coplanar with the first protruding side face 31 of the first lead 26 and the second protruding side face 32 of the second lead 27.

The gate lead 63 is aligned with and positioned in a row with the first lead 26 such that the first and third protruding side faces 31, 64 are arranged in a row extending parallel to the first main surface 22 of the semiconductor die 21, as can also be seen in the view of the footprint in FIG. 3B. The distal end 65 of the gate lead 63 also includes a recess 67 in an inner surface 66 such that the thickness of the distal end 65 is less than the thickness of the portion of the third lead 63 which is attached to the gate electrode 61 and such that the third protruding side face 64 is laterally spaced apart by a distance from the first main surface 22 of the semiconductor die 21. The thickness of the distal end 65 of the gate lead 63 may be substantially the same as the thickness of the distal end 30 of the first lead 26 and also the thickness of the distal end of the 32 of the second lead 27.

The gate lead 63 also includes a further recess 68 in a vertical edge of the outer surface 68 that opposes the inner surface 66. The further recess 68 extends over the entire height of the gate lead 63. This arrangement results in the gate lead 63 being offset inwardly from the contour of the package 60 defined by the side faces of the first and second leads 26, 27. This arrangement of the gate lead 63 may be used so that the gate lead 63 can be covered by the mold compound 36, whilst the outer surfaces of the leads 26, 26 remain uncovered by the mold compound 36.

Figure 4A:
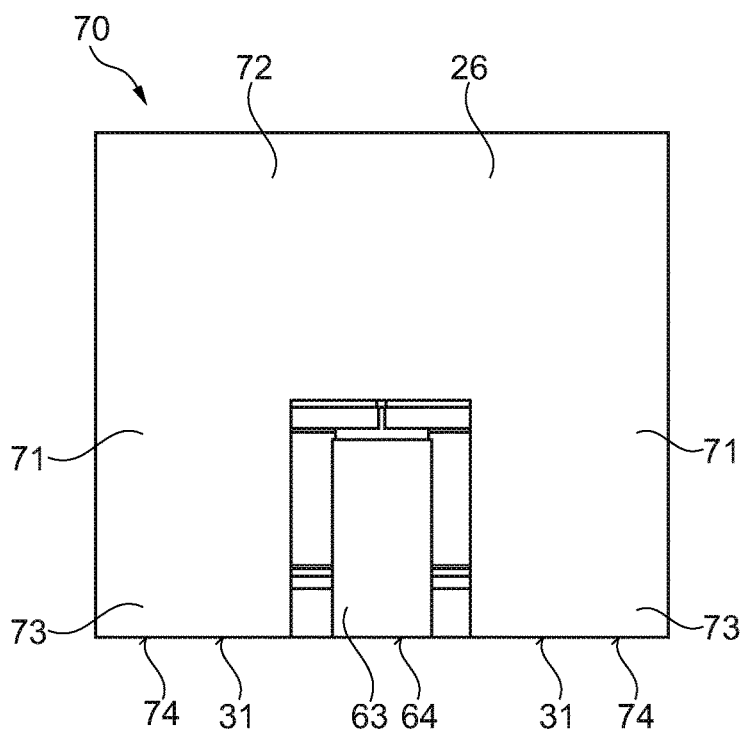
FIGS. 4A to 4E illustrate a semiconductor package according to an embodiment.
Figure 4B:
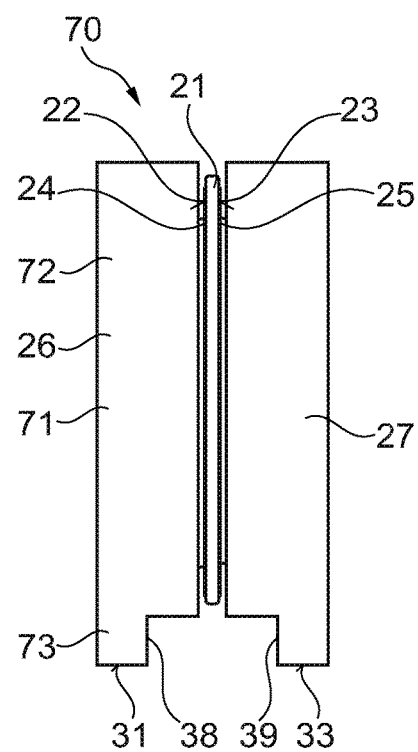
Figure 4C:
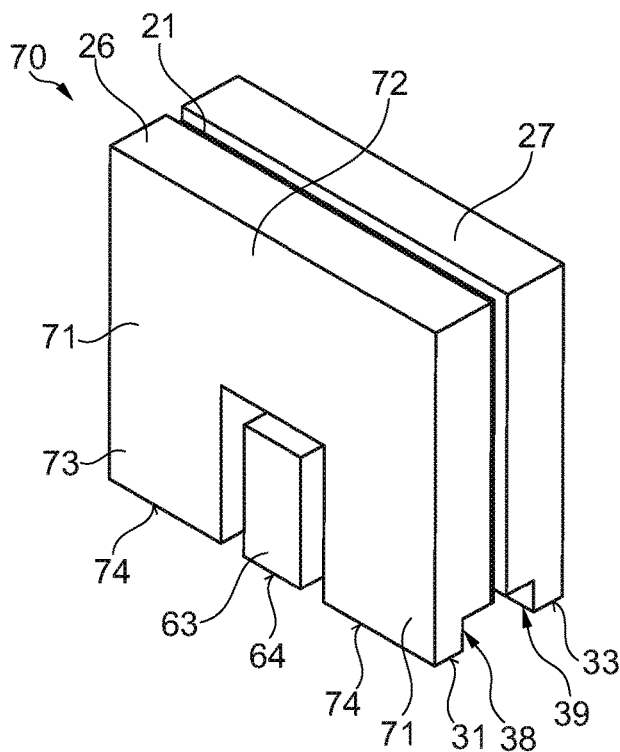
Figure 4D:
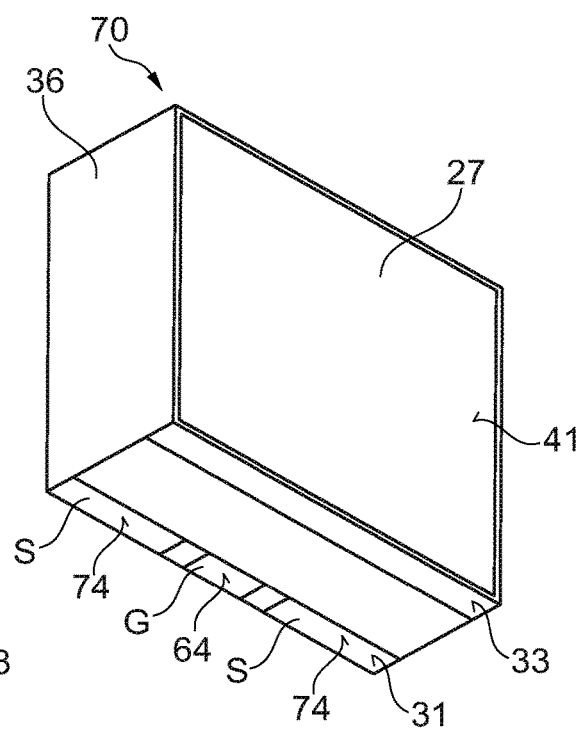
Figure 4E:
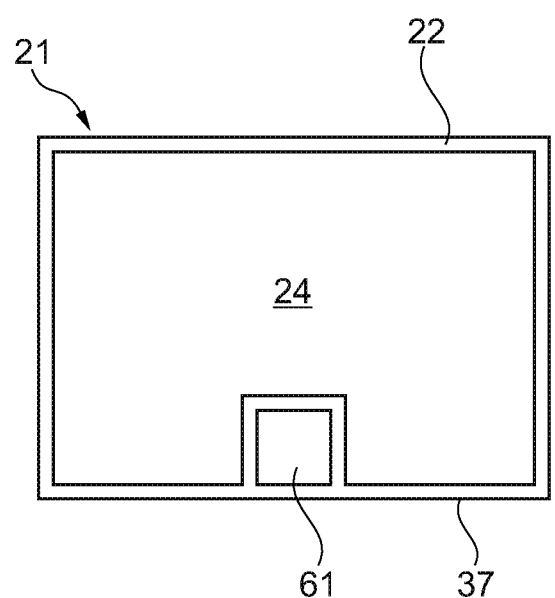

FIGS. 4A to 4E illustrate views of a semiconductor package 70 including a transistor device according to an embodiment. FIG. 4A illustrates a side view, FIG. 4B a cross-sectional view, FIG. 4C a perspective view and FIG. 4D a perspective view of the lower surface and footprint of the semiconductor package 70. FIG. 4E illustrates a plan view of the first main surface 22 of the semiconductor die 21 of the semiconductor package 70.

As can be seen in FIG. 4E, the semiconductor die 21 includes a transistor device and has a first power electrode 24 which provides the source electrode and a gate electrode 61 on its first main surface 22. The semiconductor die 21 differs from that of FIGS. 3A and 3B in the position of the gate electrode 61 on the first main surface 22. In the semiconductor die 21 of the semiconductor package 70, the gate electrode 61 is positioned towards the centre of the lower side of the main surface 22 rather than in a corner as in the embodiment illustrated in FIGS. 3A and 3B. The gate electrode 61 is positioned in the centre of the main surface 22 adjacent the side face 37 such that it faces towards the lower surface and footprint of the semiconductor package 70.

As can be seen in FIGS. 4A and 4B, in this embodiment, the first lead 26 has a U-shape with the two arms 71 of the U positioned on opposing lateral sides of the gate electrode 61 and the bar 72 of the U shape being positioned above the gate electrode 61. The two arms 71 are positioned such that the distal ends 73 of the two arms 71 provide two portions 74 of the first protruding side face 31 which are electrically coupled to the source electrode 26. The inner surface 28 of the first lead 26 includes a recess 38 as can be seen in the cross-sectional view of FIG. 4B and the perspective view of FIG. 4C. Therefore, each of the distal ends 73 of the arms 71 of the U-shaped first lead 26 includes a recess 38 at the lower edge of the inner surface 28.

The semiconductor package 70 also includes a gate lead 63 which is positioned between and spaced apart from the arms 71 of the U-shaped first lead 26. The gate lead 63 is attached and electrically connected to the gate electrode 61 and has a distal end 65 providing the third protruding side face 64 which is substantially coplanar with the two portions 74 of the first protruding side face 31. The third protruding surface 64 is arranged laterally between and aligned in a row with the two portions 74 of the first protruding side face 31 as can be seen in the perspective view of FIGS. 4C and 4C. The two portions 74 are substantially coplanar with the third protruding side face 64 of the gate lead 63 and the second protruding side face 33 of the second lead 27 which is mounted on the drain electrode 25 on the opposing second main surface 23 of the semiconductor die 21.

FIG. 4D illustrates a perspective view of the semiconductor package 70 which shows mold compound 36. The mold compound 36 covers the side faces of the semiconductor die 21, inner surfaces 28, 29, 66 of the first, second and third lead 26, 27, 63, respectively and also the recesses 38, 39, 67. The protruding side faces, 31, 33, 63 remain exposed from the mold compound 36 to provide the outer contact pads of the semiconductor package 70. The outer surfaces 40, 41 of the first and second leads 26, 27 also remain exposed from the mold compound 36 so as to improve heat dissipation from the package 70 and also to enable the package to be stacked to produce a module.

FIGS. 5A to 5D illustrate a conductor module 80 including two subassemblies 70, 70' each provided by the semiconductor package 70 described with reference to FIGS. 4A to 4E. The semiconductor module 80 includes two transistor devices which are electrically coupled in parallel.

Figure 5A:
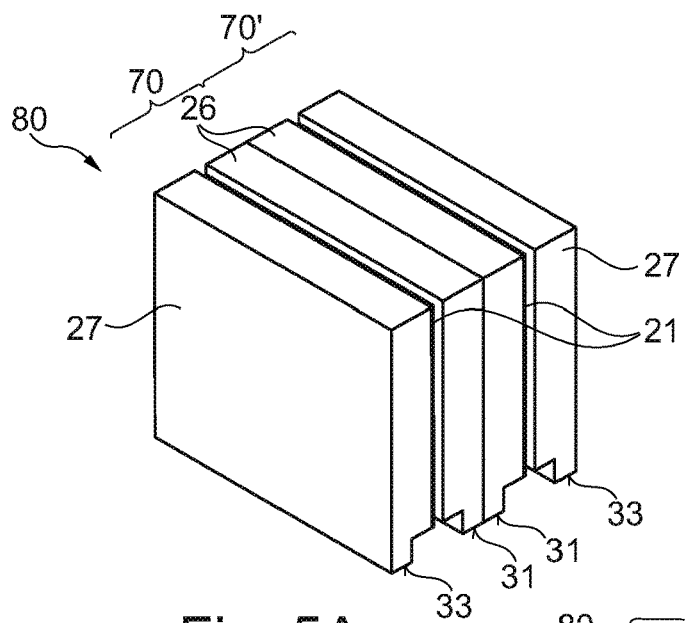
FIGS. 5A to 5D illustrate a semiconductor module according to an embodiment.
Figure 5B:
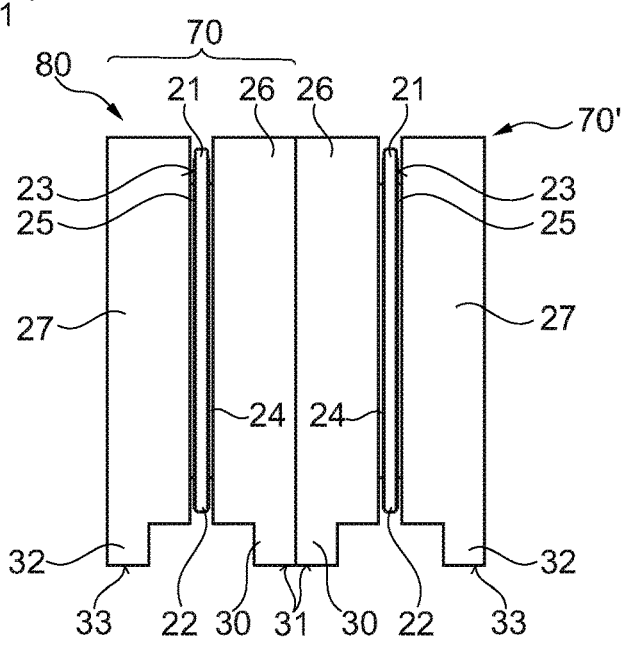
Figure 5C:
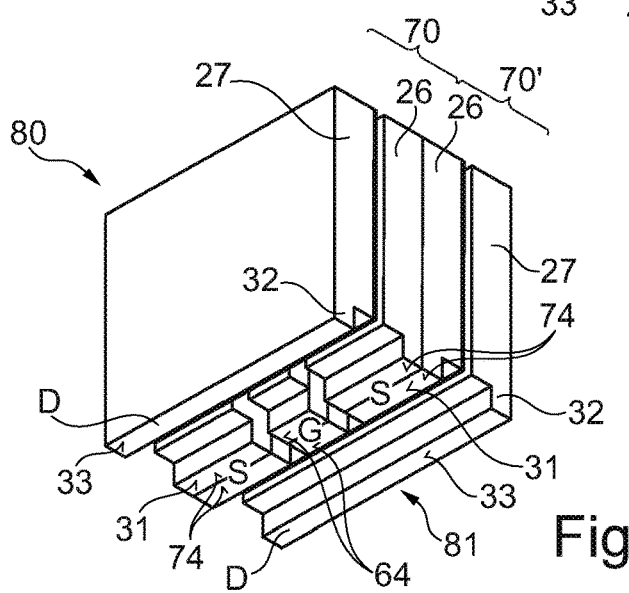
Figure 5D:
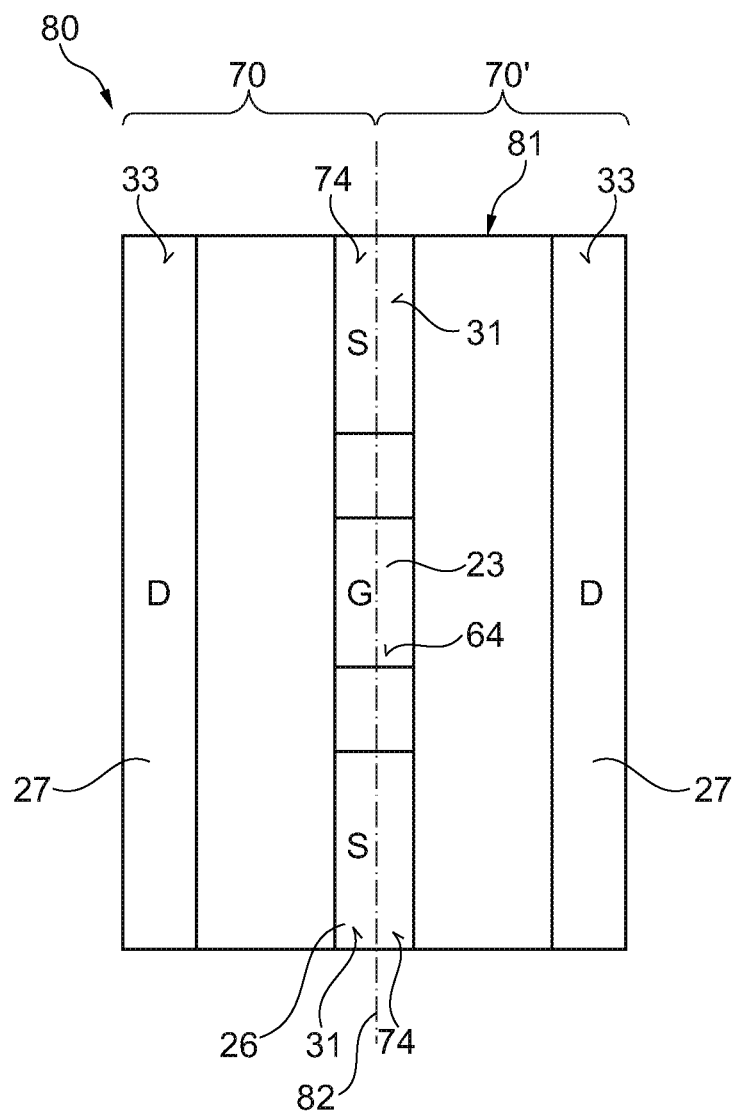

FIG. 5A illustrates a perspective view, FIG. 5B a cross-sectional view, FIG. 5C a perspective view of the lower surface and FIG. 5D the footprint of the semiconductor module 80.

The two packages 70, 70' are electrically connected to one another such that the U-shaped first leads 26 are attached and electrically connected together and such that the gate leads 63 are attached and electrically connected to one another, for example, by solder. The two packages 70 are aligned relative to one another such that the protruding side faces 31, 33, 64 are substantially coplanar on the lower surface 81 of the semiconductor module. The semiconductor module 80 therefore has a footprint, which can be seen in FIG. 5C, in which the third protruding side face 64 which provides the outer contact pad for the gate electrode 61 is positioned in the centre of the lower surface 81 and therefore at the centre of the footprint of the semiconductor module 80. The two portions 74 of the first protruding side face 31, which provides the source outer contact pad, are positioned at opposing edges of the lower surface 81 and the footprint along a centre plane 82 of the module 80 and on opposing sides of the third protruding side face 64.

The two semiconductor dies 21 with the transistor devices are positioned on opposing sides of the centre plane 82 and substantially equidistant from the centre plane 82. The two second leads 27 and two second protruding side faces 33 are, therefore, also positioned on opposing sides of the footprint of the semiconductor module 80 and have a long dimension that is substantially equidistant from the centre plane and that extends parallel to the centre plane and the row formed by the two portions 74 of the protruding first side face 31 and third protruding side face 63.

The design of the semiconductor package 70 and, in particular, the position of the gate 61 in the centre of the first main surface 22 of the semiconductor die 21 and consequently the position of the gate lead 63 between the two arms of the U-shaped first lead 26 has the advantage that the two substantially identical packages 70; 70' can be simply sandwiched together to connect the two transistor devices in parallel.

Figure 6A:
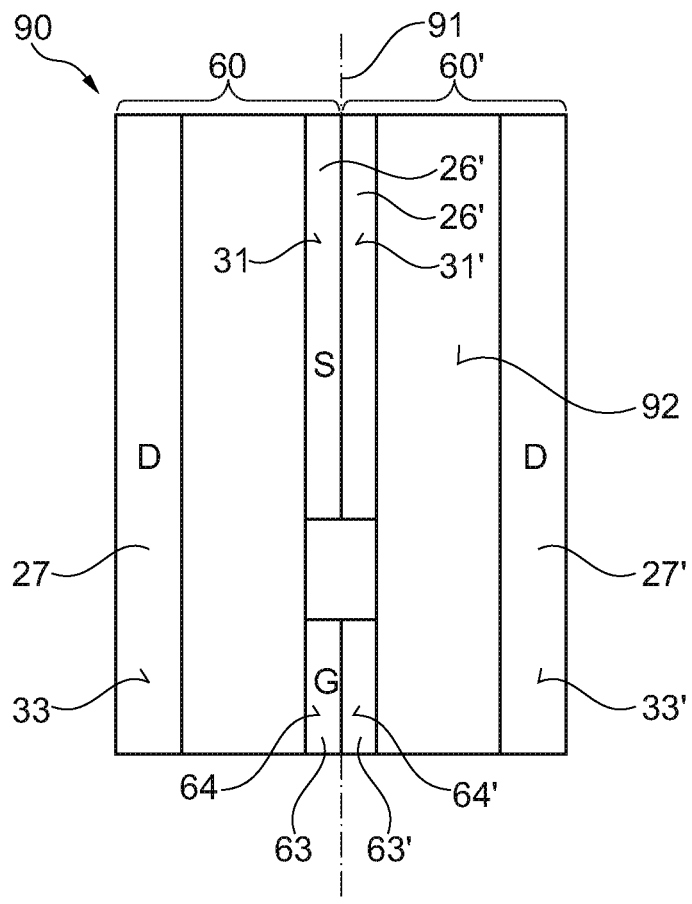
FIGS. 6A and 6B illustrate a semiconductor module according to an embodiment.
Figure 6B:
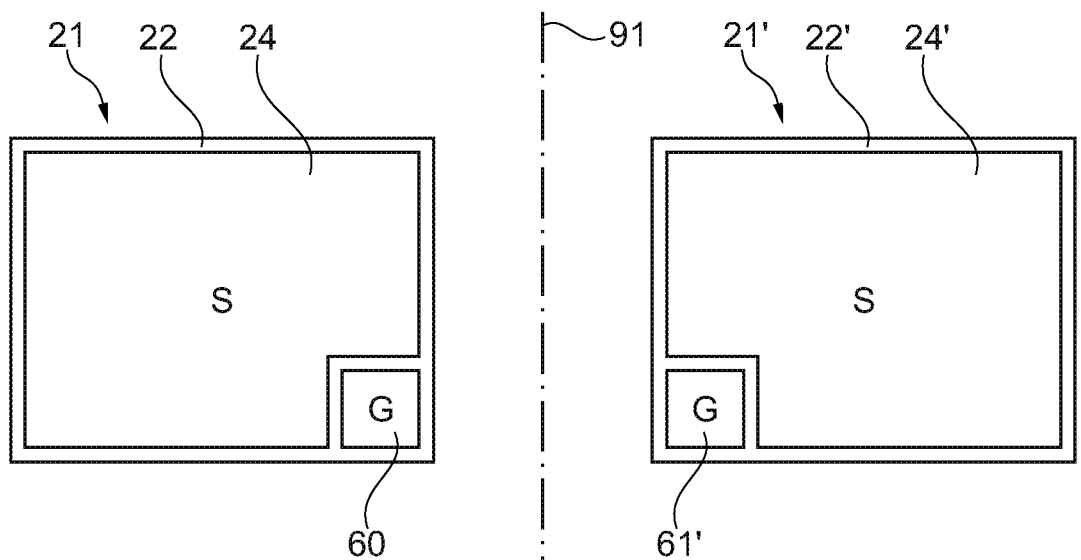

FIGS. 6A and 6B illustrate a semiconductor module 90 which includes two subassemblies 60, 60', each provided by a semiconductor package 60 in which the gate electrode is positioned in a corner of the first main surface 22 of the semiconductor die 21. FIG. 6A illustrates a view of the lower surface 92 of the semiconductor module 90 and FIG. 6B plan view of the first main surface 22, 22' of the semiconductor dies 21, 21' of the two assemblies 60, 60', respectively.

In order to electrically connect the two transistor devices in parallel by attaching the third gate leads 63 of the two packages 60, 60' to one another and the two first leads 26 of the packages 60, 60' to one another, the second package 60' and, in particular, both the first main surface 22 of the semiconductor die 20 and the first lead 26, has a design which is mirror symmetrical to the arrangement illustrated in FIGS. 3A and 3B for the semiconductor package 60. This mirror symmetrical arrangement of the semiconductor dies 21, 21' of the packages 60, 60' about the centre plane 91 of the semiconductor module 90 is illustrated in FIG. 6B.

This mirror symmetrical arrangement enables that the first leads 24 and the third leads 63 face towards one another when the two packages are sandwiched together to form the footprint illustrated in FIG. 6A.

In the lower surface 92 and, therefore, in the footprint of the semiconductor module 90, the gate contact G provided by the third protruding surfaces 64 of the two assemblies 60, 60' is positioned towards one side along the centre plane 91 and the source contact S provided by the first protruding side faces 31 of the two assemblies 60, 60' is positioned at the opposing side along the centre plane. The semiconductor module 90 includes two drain contacts D, each provided by a second protruding side face 33 of one of two assemblies 60, 60'. The protruding side faces 33 are positioned on opposing sides of the centre plane 91 and equidistant from the centre plane 91. The length of the two protruding side faces 33 is substantially parallel to the centre plane and to the row formed by the first and third protruding side faces 31, 64.

A method for manufacturing a semiconductor package and a semiconductor module will now be described with reference to FIGS. 7A to 7H. This method may be used for fabricating the semiconductor packages and semiconductor modules described with reference to FIGS. 1A to 6B.

Figure 7A:
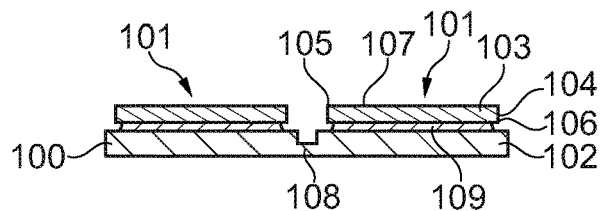
FIGS. 7A to 7H illustrate a method of fabricating a semiconductor module according to an embodiment.

Referring to FIG. 7A, a leadframe 100 is provided which includes a plurality of component positions 101. The component positions 101 are typically arranged in a regular grid of rows and columns. Each component position 101 comprises a die pad 102 in which a semiconductor die 103 can be mounted. Each of the semiconductor dies 103 includes opposing first and second main surfaces 104, 105 with a first power electrode 106 arranged on the first main surface 104 and a second power electrode 107 arranged on the second main surface 105. Referring to FIG. 7A, a semiconductor die 103 is mounted onto the die pad 102, for example using die attach material 109, of each component position 101 such that the first power electrode 104 is attached to and electrically connected with the die pad 102. The die pad 102 provides the first lead of the final semiconductor package or module.

In embodiments in which the semiconductor die 103 provides a transistor device, each component position 101 of the leadframe 100 also comprises a gate lead for the gate electrode arranged on the first main surface 104 of the semiconductor die 103. The arrangement of the gate lead and die pad 102 correspond to the arrangement of the first power electrode 106 and gate electrode on the first main surface 104 of the semiconductor die 103. The die pads 102 and the gate leads, if present, are held together within the leadframe 100 by connecting portions 108 which extend between component positions 101 and/or further connection portions that extend to a frame of the leadframe.

Figure 7B:
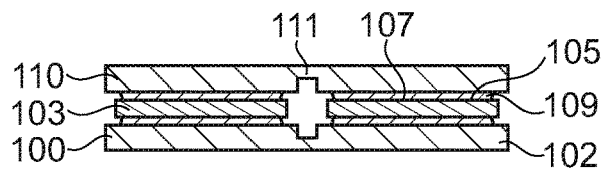

Referring to FIG. 7B, a clip 110 is mounted onto the respective semiconductor dies 103 in the component positions 101 such that the clip 110 is attached to and electrically connected with the second power electrode 107 on the second main surface 105 of the semiconductor die 100, for example by die attach material 109 or solder. The clip 110 provides the second lead 110 of the final semiconductor package or module. In some embodiments, a plurality of clips 110 are provided in the form of a strip such that the clips 110 are held together in the strip by connecting regions 111. In other embodiments, a plurality of separate individual clips 110 are provided and each clip 110 is placed individually on a respective second power electrode 107. The clips 110 or second leads may also be provided in the form of a further leadframe.

Figure 7C:
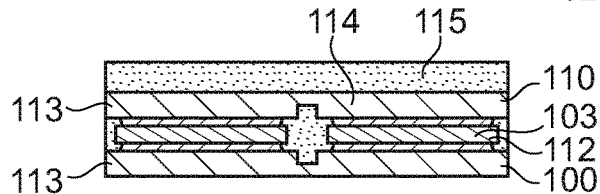

Referring to FIG. 7C, a mold compound 115 is then applied which embeds at least the side faces 112 of the semiconductor dies 103 and inner surfaces 113 of the leadframe 100 and the clip 110 in the mold compound 115 to form a subassembly. In some embodiments, the outer surface 114 of the clips 110 is also embedded in the mold compound 115. In some embodiments, the outer surface of the leadframe 100 can also be embedded in the mold material 115 such that the outer surface of the die pad 102 and, therefore, the first lead is covered in the mold compound 115 in the final semiconductor package.

Figure 7D:
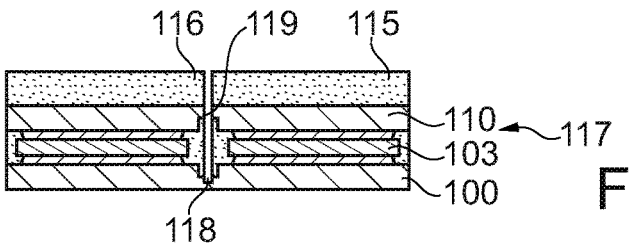

Referring to FIG. 7D, the component positions 101 are partially singulated by inserting a cut, as indicated by the arrow, between the component positions 101. The cut 116 extends through the mold compound 115 positioned on the clips 110, through any connecting regions 111 which extend between the clips 110, and through the mold compound 115 which is positioned between the semiconductor dies 103 in neighbouring component positions 101. The cut 116 may partially singulate the leadframe 100 but, in this embodiment, does not entirely singulate the leadframe 100 such that the component positions 101 of the subassembly 117 are still held together by the remaining portion of the leadframe 100. This cut 116 exposes surfaces 118, 119 of the die pad 102 of the leadframe 100 and of the clip 110, in particular of the connection portions 108, 111. The exposed surfaces 118, 119 extend substantially perpendicularly to the first main surface 104 of the semiconductor die 103 to form the first and second protruding side faces 31, 33 of the first and second leads 26, 27 of the semiconductor package or module, for example the semiconductor package or module described with reference to FIGS. 1A to 6B.

The connecting portions 108, 111 of the leadframe 100 and strip including the contact clips 110 may have a thickness which is less than the thickness of the die pad 102 and the clip 110 at the regions positioned on the semiconductor dies 102. For example, the upper surface of the leadframe 100 may be partially etched to form thinner connecting portions 108 and a thicker region for the die pads 101. These thinner connecting portions 108, 111 form the distal ends 30, 32 of the first and second leads 26, 27 with the recesses 38, 39 after the cut 116 has been inserted.

Figure 7E:
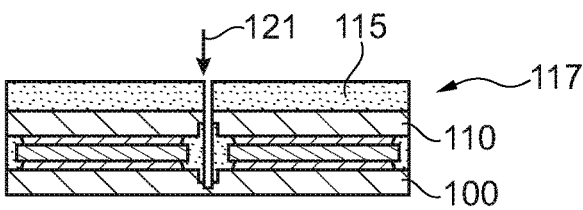

In some embodiments, a solderable coating is applied, as indicated by the arrow 121 to the exposed surfaces 118, 119 formed in the connection portions 108, 111 of the die pad 102 and clip 110, as is illustrated in FIG. 7E. In some embodiments, the cut 116 is inserted into the subassembly such that portions of the die pad 102 and clips 110 are selectively singulated and remaining portions of the leadframe and strip remain uncut so as to that the subassembly is mechanically held together and can be further worked, for example by applying the solderable coating.

In order to provide semiconductor packages, such as the semiconductor package described with reference to FIGS. 1A-1D, 3A-3B and 4A-4E, the cuts 116 may be completed by completely singulating the strip, mold compound 115 and leadframe 100. The exposed surface 118 of the connection portion 108 between the die pads 102 of the leadframe 100 provides the protruding side face 31 of the first lead 26 of the package and the exposed surface 110 of the clip 111 provides the protruding surface 33 of the second lead 27 of the package.

In embodiments in which the outer surface of the leadframe 100 remains uncovered by the mold compound 115, the subassembly 117 illustrated in FIG. 7D or FIG. 7E in which the surfaces 118, 199 are exposed by the cut 116 and, optionally, covered with solderable coating, can be used to fabricate a semiconductor module including two semiconductor dies arranged in a stack.

Figure 7F:
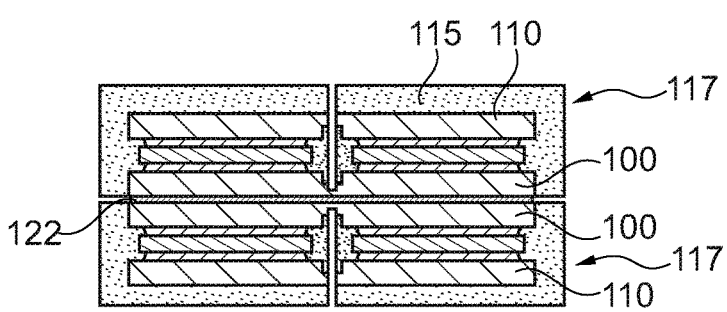
Figure 7G:
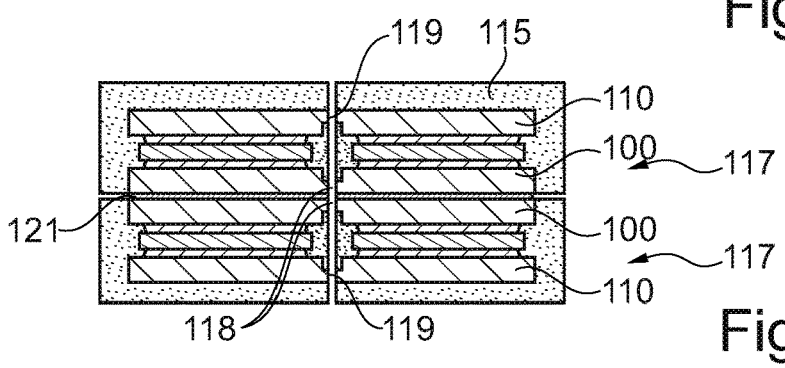

Referring to FIG. 7F, two subassemblies 117 may be stacked one on top of each other such that the outer surface of the leadframe 100 of the two subassemblies 117 is attached and electrically connected to one another, for example, by solder 122. This arrangement may be used to electrically couple the semiconductor dies 103 in each component position 101 in parallel. The upper and lower surface of the stack is covered with mold material 115. The semiconductor modules can be singulated by completing the cut 116 through the remaining portions of the two subassemblies including the leadframes 100, as is illustrated with reference to FIG. 7G.

Figure 7H:
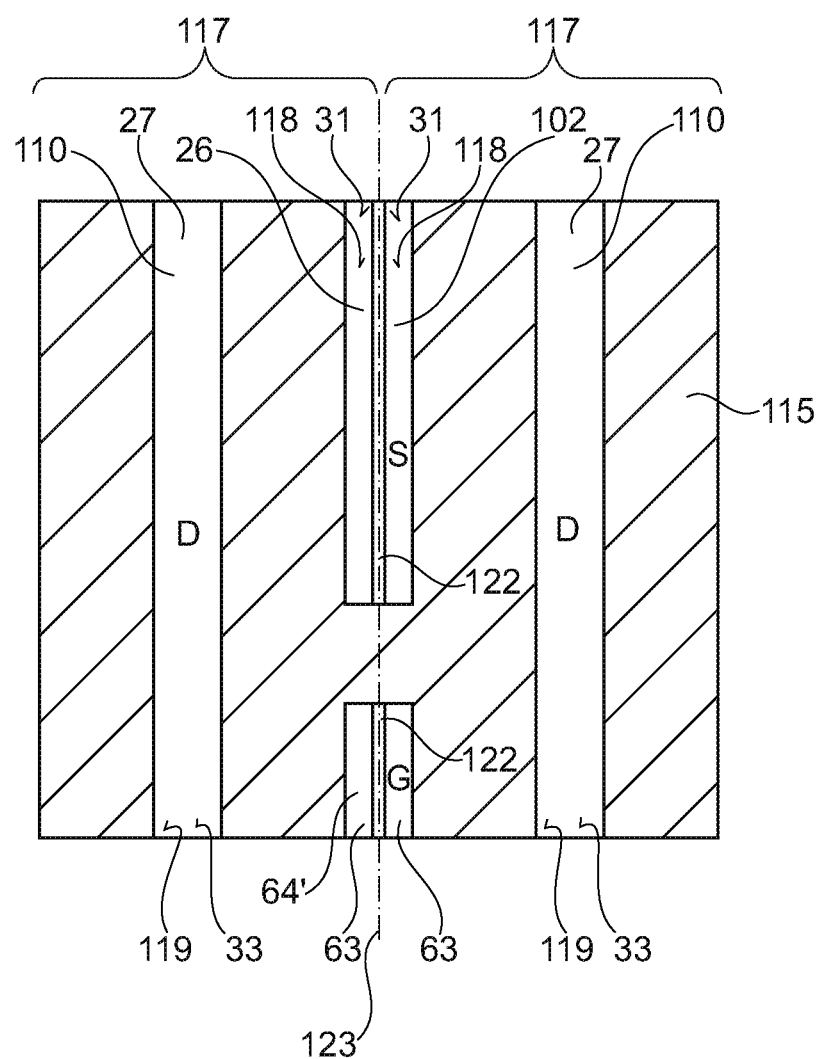

FIG. 7H illustrates a perspective view of the bottom surface of a semiconductor module which may be fabricated using the method illustrated described with reference to FIG. 7A to 7G. FIG. 7H illustrates a module corresponding to that illustrated in FIGS. 6A and 6B in which the gate outer contact pad G is provided by the protruding side faces 64 of the gate leads 63 of the two subassemblies positioned towards one side of the footprint at the centre plane 123 of the module. The source outer contact pad S provided by the protruding contact surfaces 31 of the first leads 26 provided by the die pads 102 is positioned on the opposing side along the centre plane 123. The two drain contact pads D, each provided by a protruding side face 33 of the second lead 27 provided by the clip 110, are arranged on opposing sides and spaced apart substantially equidistant from the centre plane 123. Consequently, in this embodiment, the arrangement of the two subassemblies 117 which are stacked, as described with reference to FIG. 7F have a mirror symmetric arrangement about the centre plane 123 of the semiconductor module such that the die pad 102 and first lead 26 of the two subassemblies have a mirror symmetrical arrangement. In the module illustrated in FIG. 7H the outer surfaces of the second leads 27 provided by the contact clips 110 are embedded in the mold compound 115.

FIGS. 8A to 8G illustrate a method for fabricating a semiconductor module according to an embodiment. In the method illustrated with reference to FIGS. 8A to 8C, the semiconductor dies 103 are mounted in each component position 101 of the leadframe 100 and clips 110 arranged on each of the second power electrodes 107 of the semiconductor dies 103 and the mold compound 115 is applied to form the subassembly 117 as described with reference to FIG. 7A to 7C.

Figure 8A:
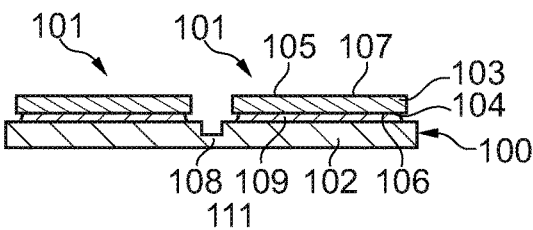
FIGS. 8A to 8G illustrate a method of fabricating a semiconductor module according to an embodiment.
Figure 8B:
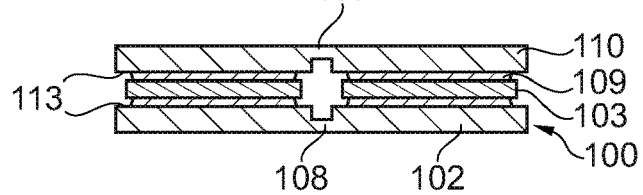
Figure 8C:
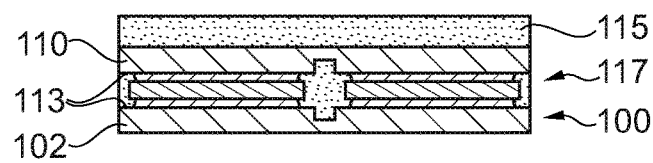
Figure 8D:
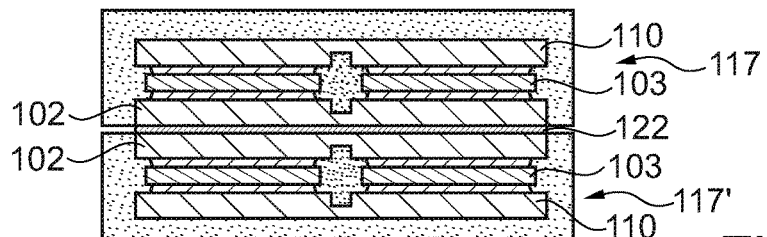

The method illustrated with reference to FIGS. 8A to 8G and, in particular with reference to FIG. 8D, differs in that these two subassemblies 117 are then stacked such that the exposed outer surface of the leadframe 100 of a first subassembly 117 is mounted on the exposed outer surface of the leadframe 100 of a second subassembly 117'. The two leadframes 100 may be attached and electrically connected to one another by electrically conductive adhesive or solder 122. This may be used to electrically couple the die pads 102 semiconductor dies 103 in each component position 101 in parallel.

Figure 8E:
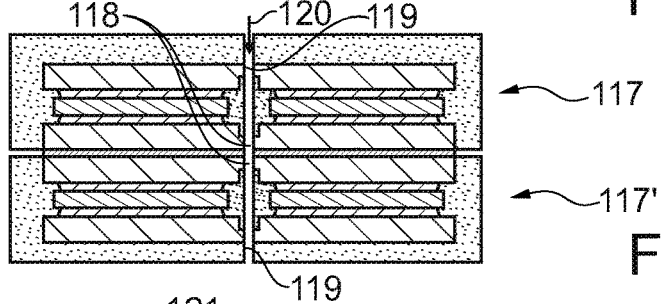

This stacked arrangement of the two subassemblies 117, 117' is then at least partially singulated by inserting a cut 120 between neighbouring component positions 101 as illustrated in FIG. 8E. This cut 120 may be inserted so as to expose the surfaces 118 of the connection regions 108 between component position 101 of the leadframes 100 and surfaces 119 of the connection portions 111 of the clips 110 which extend substantially perpendicularly to the first main surface 104 of the semiconductor die 103. These exposed surfaces 118, 119 form the protruding side faces and outer contact surfaces of the semiconductor module.

Figure 8F:
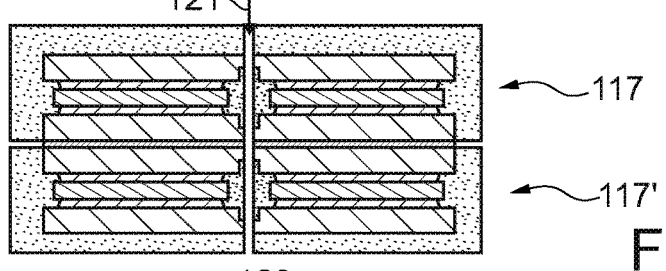
Figure 8G:
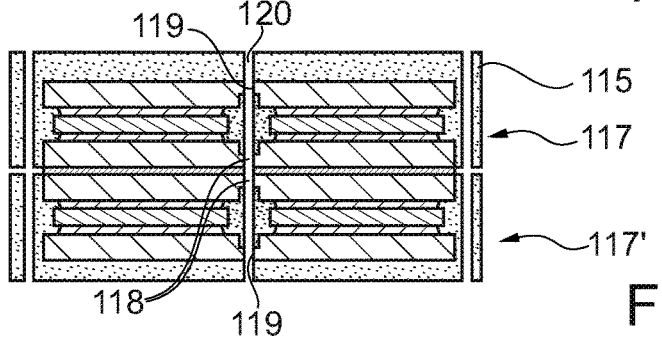

A solderable coating may be applied to these exposed surfaces as is illustrated schematically with the arrow 121 in FIG. 8F. Referring to FIG. 8G, the singulation process may then continue in order to completely singulate the semiconductor modules. For example, a portion of the mold compound 115, for example one or more peripheral portions of the mold compound 115, may remain after the cut 120 is made such that the stack of each component position 101 is held together in a subassembly.

Figure 9A:
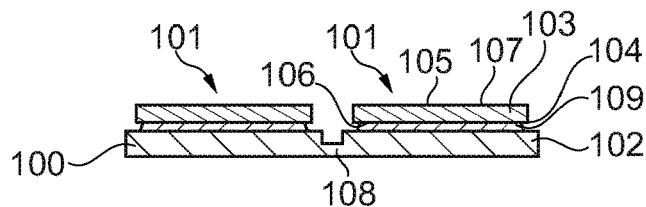
FIGS. 9A to 9F illustrate a method for fabricating a semiconductor module according to an embodiment.
Figure 9B:
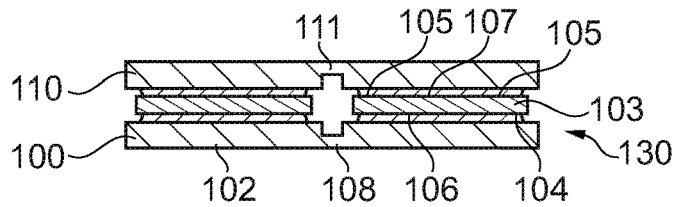

FIGS. 9A to 9F illustrate a method for fabricating a semiconductor module according to an embodiment. Referring to FIGS. 9A and 9B, the first power electrode 104 on the first main surface 106 of a semiconductor die 103 is mounted on the die pads 102 of the component positions 101 of the leadframe 100 and the conductive clips 110 are positioned are attached to the second power electrodes 107 on the second main surface 105 of the semiconductor dies 103 as illustrated in FIG. 9B.

Figure 9C:
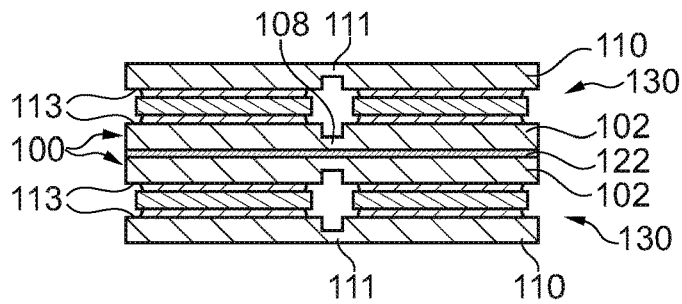
Figure 9D:
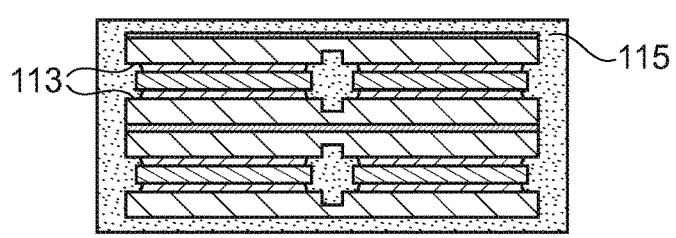
Figure 9E:
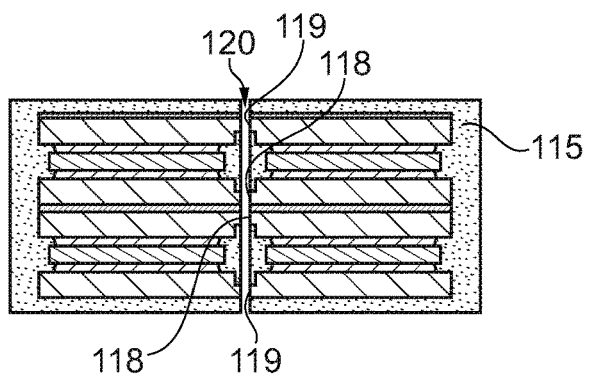
Figure 9F:
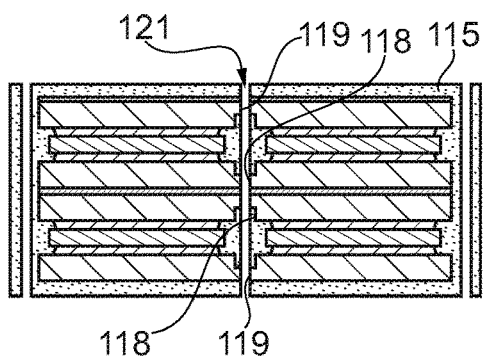

Different form the method illustrated in FIGS. 7A-7H and 8A-8G and referring to FIG. 9C, this unmolded arrangement forms a subassembly 130 and two of these subassemblies 130 are stacked one on top of the other before application of the mold material 115. The two leadframes 100 of the two subassemblies 130 may be attached to one another and electrically connected to one another by use of an electrically conductive adhesive or solder 122. Referring to FIG. 9D, the mold compound 115 is then applied to this stacked structure such that the semiconductor dies 103, the leadframes 100 and the clips 110 are embedded in and entirely covered by the mold compound 115. Referring to FIG. 9E, this molded stacked structure may be partially singulated as indicated schematically by the arrow 120 to expose the surfaces 118, 119 of the connection portions 111, 108 of the of the clips 110 and die pads 102 which are to form the outer contact pads of the semiconductor module. A solderable coating can be applied to these exposed surfaces as illustrated in FIG. 9E by the arrow 121 and the singulation process continued to singulate the individual modules as illustrated in FIG. 9F.

FIGS. 10A to 10H illustrate a method which may be used for fabricating a semiconductor package including a single semiconductor die or semiconductor module including two or more semiconductor dies.

Figure 10A:
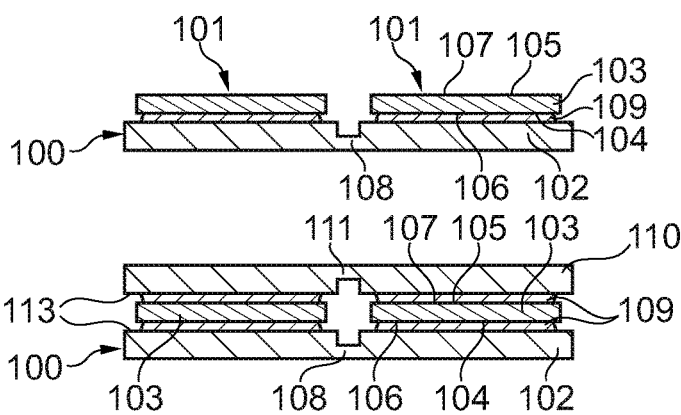
FIGS. 10A to 10H illustrate a method of fabricating a semiconductor module according to an embodiment.
Figure 10B:
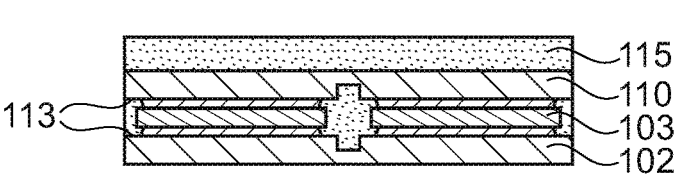
Figure 10C:
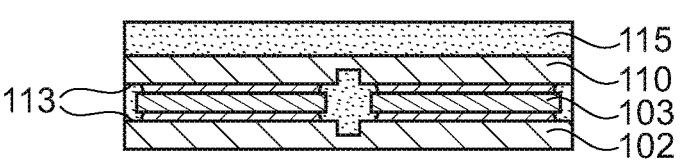
Figure 10D:
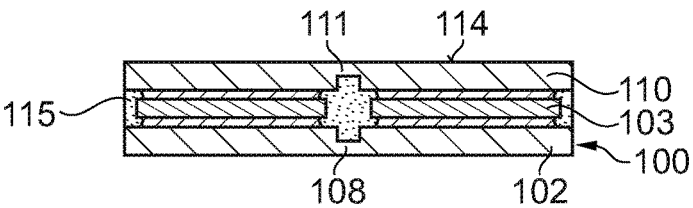

Similar to the method described with reference to FIGS. 7A to 7H, and referring to FIG. 10A, a leadframe 100 is provided which includes a plurality of component positions 101, each component position 101 including a die pad 102. In embodiments in which the package is to be used for packaging a transistor device, each component position 101 also comprises a gate lead. The semiconductor die 103 is mounted on the die pad 102 by die attach material such that the first power electrode 106 on the first main surface 104 is attached and electrically connected to the die pad 102, as illustrated in FIG. 10A. A second clip 110 is attached to the second power electrode 107 arranged on the second main surface 105 by die attach material 109, as illustrated in FIG. 10B. In the illustrated embodiment, the clips 110 are held together in a strip by connecting regions 111. A mold material 115 is applied which surrounds the side faces and space between the inner surfaces 113 of the leadframe 100 and clips 110 as well as the outer surface 114 of the clips 110, as illustrated in FIG. 10C. The method described with reference to FIGS. 10A to 10H differs in that the portion of the mold compound 115 which is positioned on the outer surface 114 of the clips 110 is then removed to expose the underlying metallic surface of the clips 110, as illustrated in FIG. 10D, to form a subassembly. The mold compound 115 may be removed by grinding, for example.

Figure 10E:
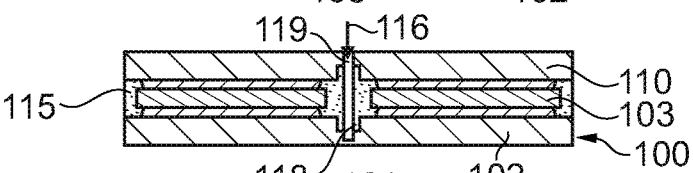
Figure 10F:
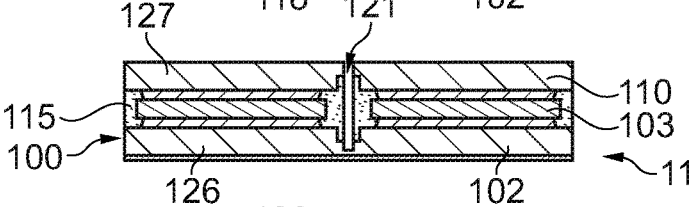

The connecting regions 111 and 108 of the clips 110 and leadframe 100 are partially or completely singulated by cutting between neighbouring component positions 101, as illustrated in FIG. 10E, whereby the leadframe 100 is not entirely singulated it so that the subassembly 117 at this stage is still mechanically integral. The exposed surfaces 118, 119 of the clip 110 and die pad 102 may be coated with a solderable layer as illustrated in FIG. 10F schematically by the arrow 121. The singulation process of the subassembly 117 may then be completed to produce a semiconductor package including a single semiconductor die 103. The semiconductor package includes leads 126, 127 provided by the die pad 102 and clip 110 respectively positioned on opposing surfaces of the semiconductor die 103 which are exposed from the mold compound 115. This arrangement may be used to enable better heat dissipation from the leads 126, 127 and to enable a lower resistance thermal connection between the leads and any heat dissipators or heat sinks attached to them.

Figure 10G:
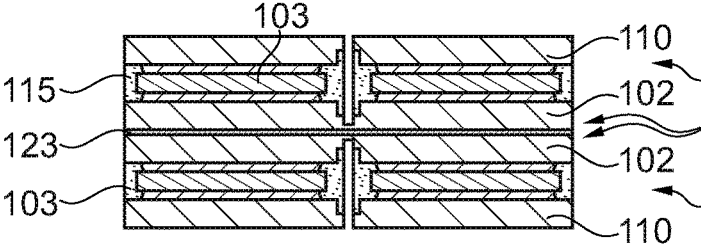

To form a module including two semiconductor dies 103, two of the subassemblies 117 illustrated in FIG. 10F may then be stacked on top of one another, as illustrated in FIG. 10G, such that the leadframes 100 of the two subassemblies 117 face towards one another and such that the two leadframes 100 are attached and electrically connected to one another by electrically conductive material, such as electrically conductive adhesive or solder 123.

Figure 10H:
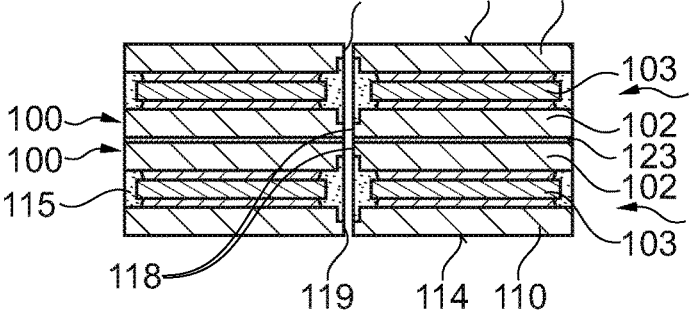

The singulation process is now completed, as illustrated in FIG. 10H, by completing the cut 116 to singulate the connection portions 106 and die pads 102 of the leadframe 100. This provides a semiconductor module including two semiconductor dies 103 that are arranged substantially parallel to one another and electrically coupled in parallel. The outermost surfaces 114 of the clips 110 are exposed from the mold material 115 as are the peripheral side faces 118, 119 of the connection portions 108, 111 at the lower surface of the module in order to form the outer contact pads. The side faces of the clips 110 and of the die pads 102 are also exposed from the mold material 115 at the upper surface of the module.

In the embodiments described with reference to FIGS. 1A to 10H, the semiconductor package and semiconductor module are mounted on the redistribution board such that the first and second main surfaces of the semiconductor dies and the entire height of the leads are positioned substantially perpendicular to the main surface of the redistribution board. In this mounted position, the semiconductor package and semiconductor module occupies an area on the redistribution board that corresponds to the area defined by the outer surfaces of the leads in embodiments in which the leads are exposed from the mold compound, and/or the mold compound in embodiments in which the outer surfaces of the leads are embedded in the mold compound. The area of the package at the footprint at its lower surface is substantially the same as the area of the package at the opposing upper surface. The peripheral side faces which provide the outer contact pads of the semiconductor package or semiconductor module have a contact interface area with the redistribution board that corresponds to the thickness and breadth of the distal end of the lead.

Figure 11A:
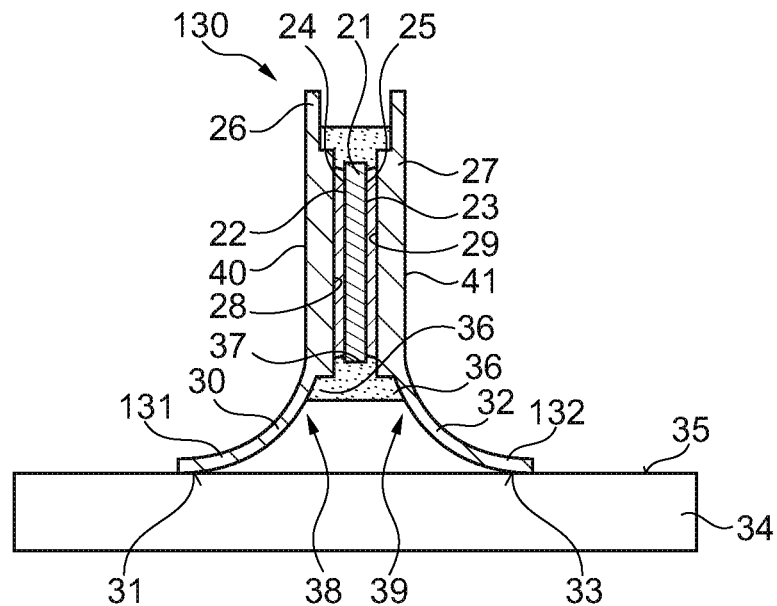
FIGS. 11A and 11B illustrate a semiconductor package according to an embodiment and a semiconductor module according to an embodiment.
Figure 11B:
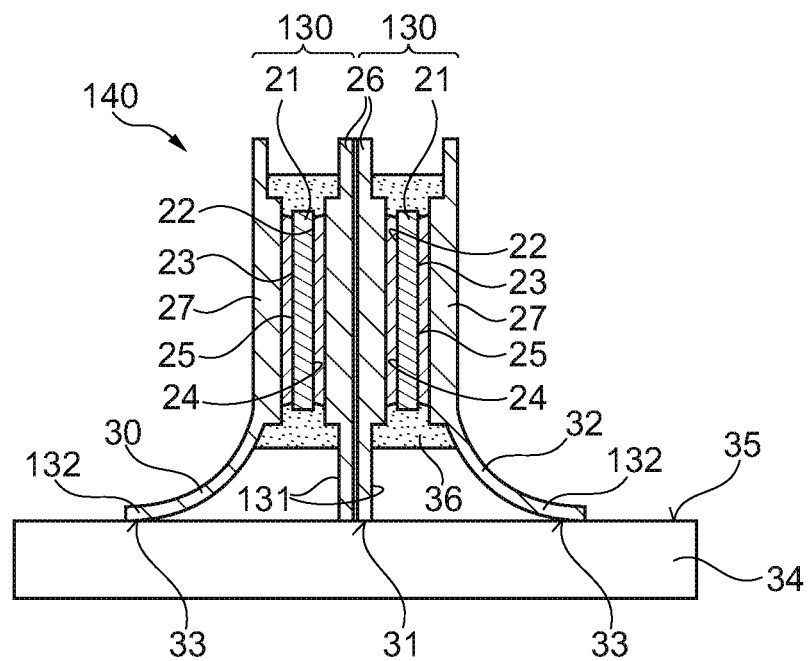

FIGS. 11A and 11B illustrate a semiconductor package and a semiconductor module, respectively, which differs from those illustrated in FIGS. 1A to 10H in the form of the outer contact pads.

The semiconductor package 130 includes a semiconductor die 21 having first and second power electrodes 24, 25 on opposing first and second main surfaces 22, 23, a first lead 26 and a second lead 27 arranged on the opposing main surfaces 22,23. The first lead 26 has a distal end 30 that protrudes over a side face 37 of the semiconductor die 21 and that includes a recess 38 arranged in an edge of the inner surface 28. The first lead 26 includes a thicker connection portion having an inner surface 28 that is electrically connected to the first power electrode 24 on the first main surface 22. The second lead 27 also has a distal end 32 that includes a recess 39 arranged in an edge of the inner surface 29. The second lead 27 includes a thicker connection portion having an inner surface 29 that is arranged on and electrically connected to the second power electrode 25 on the second main surface 23.

The semiconductor package 130 differs in the arrangement of the distal ends 30, 32 of the first and second leads 26, 27. The distal end 30 of the first lead 26 and its recess 38 includes an extended length providing an extension 131 of the thinner distal end 30 that it can be bent laterally away to form a L-shape. The inner surface 28 of the bent distal end 30 extends substantially perpendicular to the first main surface 22 of the semiconductor die 21 and laterally away from the first main surface 22 and provides the outer contact surface of the first lead 26.

The second lead 27 has a similar form such that the opposing leads 26, 27 extend in opposing lateral directions away from the semiconductor die 21. The distal end 32 of the second lead 27 and its recess 39 includes an extended length providing an extension 132 of the thinner distal end 32 that it can be bent laterally away to form a L-shape. The inner surface 29 of the bent distal end 32 extends substantially perpendicularly to the second main surface 23 of the semiconductor die 21 and laterally away from the second main surface 23 and provides the outer contact surface of the second lead 27.

The thickness of the distal ends 30, 32 may be selected so as to allow the distal end 30, 32 to be more easily bent to form the L-shape.

The leads 26, 27 have an L type shape so that the area of the footprint of the semiconductor package 130 is greater than the area of the semiconductor package at the opposing upper surface. This arrangement may be used to increase the stability of the mechanical connection between the semiconductor package 130 and the redistribution board 34. This arrangement may also be used to increase the interfacial area of the contact between the protruding side faces 31, 33 of the first leads 26, 27 and contact areas on the redistribution board 34 and to reduce the contact resistance.

FIG. 11B illustrates a module 140 comprising two subassemblies, each provided by a semiconductor package 130. The subassemblies 130 are arranged in a stack, as in the semiconductor module described with reference to FIGS. 2A-2D and 5A to 10H, but which differs in that the outermost leads 27 are L-shaped. In the semiconductor module 140. The first leads 26 of the two subassemblies 130 that are attached and electrically connected to one another at the centre of the module 140 have a substantially vertical form, whereas the second leads 27 arranged at the two opposing sides of the module 140 have an L-shaped form, as in the semiconductor package illustrated in FIG. 11A, and extend in opposing directions way from the centre of the module.

A method for fabricating a semiconductor package and a semiconductor module having L-shaped outer contact pads will now be described with reference to FIGS. 12A to 12G.

Referring to FIG. 12A, a leadframe 100 is provided which includes a plurality of component positions 101 each including a die pad 102 having a lateral area which is at least as large as lateral area of the semiconductor die 103. In embodiments in which the semiconductor die 103 is a transistor device, the leadframe 100 also includes a gate lead in each of the component positions 101. The die pad 102 and, if present, the gate lead of the individual component positions 101 are held together in the leadframe 100 by connecting portions 108 as in the leadframes 100 illustrated with reference to FIGS. 7A to 10H. However, the length of the connection region 108 is larger such that the connection region 108 provides the extension 131 to the distal end 30 of the two leads 26 that are coupled by the connection region 108, the extension 131 of the distal end 30 can be bent to form the L-shaped outer contact surface 31.

Similarly, the individual clips 110 or the connection regions 111 between the clips 110, in embodiments in which the clips 100 are provided in the form of a strip or leadframe, have an extended length so as to provide the extensions 132 to the distal portions 32 of two adjoining clips 110 and the L-shaped contacts of the second leads 27.

The method may then continue in a similar manner to the methods described with reference to FIGS. 7A to 10H. Referring to FIG. 12A, the first power electrode 104 on the first major surface 106 of the semiconductor dies 103 is mounted on the die pad 102 in the respective component positions 101 of the leadframe 100, the clips 110 are attached to the second power electrode 105 on the second 107 on the second main surface 105 of the semiconductor die 103, as illustrated in FIG. 12B, and mold compound 115 is applied which covers at least the side faces of the semiconductor die 103 and inner surfaces 113 of the contact clips 110 and leadframe 100 in regions around the semiconductor die 103, as illustrated in FIG. 12C. At least the centre portions of the connecting regions 108, 111 remain exposed from the mold compound 115 such that they can provide the extensions 131, 132 of the leads 26, 27 and the L-shaped contacts of the semiconductor package or semiconductor module.

In some embodiments, if the mold compound 115 is applied to the outer surface of the clips 110, as is illustrated in FIG. 12C, it can be removed to expose the metallic material of the contact clips 110, as illustrated in FIG. 12D, to form a subassembly 141. The subassembly 141 of FIG. 12D may be singulated, as indicated schematically by arrow 116, to form semiconductor packages including a single semiconductor die, such as the semiconductor package 130. The singulation process may be performed in two steps with the region connection regions 108, 111 which are to form the outer contact pads of the semiconductor package being first singulated and then remaining portions of the leadframe 100 subsequently singulated to separate the packages from the leadframe 100.

To form a semiconductor module including two semiconductor dies 103, two subassemblies 141 may be stacked one on top of the other such that the leadframes 100 of the subassemblies 141 are face towards one another and are electrically connected to one another as illustrated in FIG. 12E. This stacked structure may be singulated again in one or two stages as illustrated schematically in FIG. 12F by arrow 116. The outermost connecting portions 111 of the clips 110 provide the extensions 132 of the second leads 27 of the semiconductor module. These extended distal ends 32 are then bent outwardly to form the L-shaped contacts as indicated schematically in FIG. 12G by arrow 143. In contrast, the extended connection portions 108 of the leadframe 100 which provide the first leads 26 may be remain substantially planar and may be further cut to length, as indicated schematically by arrow 142, such that the protruding side face 31 is substantially coplanar with the protruding side faces 33 provided by the lower surface of the bent leads 27 to form semiconductor module as illustrated in FIG. 11B.

The semiconductor packages and modules described herein are mounted substantially perpendicularly to the main surface of a board such that the main surfaces of the semiconductor die, as defined by the width and breadth of the substantially cuboid semiconductor die is perpendicular to the main surface of the board. The area of the semiconductor die defined by the thickness and breadth (or thickness and width) is mounted substantially parallel to the main surface of the board. The thickness of the semiconductor die is typically much smaller than its width and breadth. The footprint area of the vertical devices is defined by the chip thickness and breadth, rather than by the breadth and width as for devices with a lateral or horizontal position of the die with respect to the board. This arrangement enables the package footprint area to be reduced by having the outer contact pads of the device extend perpendicularly to the main surfaces of the semiconductor die and the main surface of the semiconductor die be positioned perpendicularly to the surface of the board on which it is mounted. This also enables chips of various dimensions to be accommodated without a proportional increase of the footprint area.

The combination of two transistor devices connected in parallel in one discrete module can be used to achieve a reduction in overall Rdson of the device including a reduction in conduction losses by two times as compared with one-chip packages. Additionally, package parasitics are reduced and the thermal properties are improved.

The vertically mounted packages described herein having a single semiconductor die have a more compact footprint as the footprint area can be reduced by 2-3 times compared to a package in which the semiconductor die is mounted laterally or horizontally. Low package parasitics including a reduction of both resistance and inductance values are provided. Double-sided cooling and possible enhancing of exposed versions by heatsinks can be provided. The electric current distribution is smoother and oppositely directed currents ensure low radiated emissions.

The parallel connection of chips reduces current flowing through each of them by 50% as compared with a package including a single chip. This also leads to a reduction in heat generation in each chip. Alternatively, a module with parallel coupled transistor devices can be used to switch higher currents within the same safe area of operation. The vertical packages and modules described herein provide much smoother current density distributions that reduce Ohmic losses in the package and module and its overall DC resistance.

A reduction in the current load through each chip and current density values by 2 times and a compact footprint, since the footprint area can be reduced by around 30%, can be provided. Additionally, a known CanPAK-type footprint can be provided in case of corner gate chip layout. Double-sided cooling and possible enhancing of exposed versions by heatsinks, low package parasitics including reduction of the package resistance by 69% and inductance by 60%, smoother electric current distribution in the package and at the chip-package interfaces and oppositely directed currents that result in low radiated emissions are provided.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor package, the method comprising:

providing a leadframe comprising a plurality of component positions, each component position comprising a die pad;
providing a plurality of semiconductor dies, each comprising opposing first and second main surfaces, a first power electrode on the first main surface and a second power electrode on the second main surface;
mounting a respective semiconductor die onto the die pad of a respective component position of the leadframe such that the first power electrode is attached to the die pad;
mounting a clip onto the respective semiconductor dies such that the clip is attached to a respective second power electrode;
applying a mold compound and embedding at least side faces of the semiconductor dies and inner surfaces of the leadframe and the clip in the mold compound to form a subassembly; and
cutting through the clip and the leadframe at positions between neighbouring component positions, thereby exposing surfaces of the die pad and the clip that extend substantially perpendicularly to the first main surface of the semiconductor die to form first and second outer contact pads of the semiconductor package,
wherein the cutting through the clip and the leadframe at positions between neighbouring component positions comprises:
selectively singulating portions of the die pad and the clip to form the first and second outer contact pads;
applying a solderable coating to the first and second outer pads of the die pad and the clip; and
singulating remaining portions of the leadframe to form a plurality of semiconductor packages.

2. The method of claim 1,
wherein the semiconductor die comprises a transistor, the first power electrode is a source electrode, the second power electrode is a drain electrode and the semiconductor die further comprises a gate electrode on the first main surface, and
wherein the leadframe further comprises a gate lead in each component position,
wherein the method further comprises attaching the gate electrode of the semiconductor die to the gate lead.

3. The method of claim 1, further comprising providing each clip as part of a strip that includes individual clips held together in the strip by connecting regions.

4. The method of claim 1, wherein mounting the clip onto the respective semiconductor dies comprises placing an individual clip on a respective second power electrode of the semiconductor dies.

5. The method of claim 1, further comprising providing each clip in a form of a further leadframe.

6. The method of claim 1, wherein the cutting produces a cut that extends through the mold compound positioned on each clip, through any connecting regions which extend between adjacent clips, and through the mold compound which is positioned between the semiconductor dies in neighbouring component positions.

7. The method of claim 6, wherein the connecting regions of the leadframe and a strip that includes each clip have a thickness which is less than a thickness of the die pads and each clip at regions positioned on the semiconductor dies.

8. A method for manufacturing a semiconductor package, the method comprising:
providing a leadframe comprising a plurality of component positions, each component position comprising a die pad;
providing a plurality of semiconductor dies, each comprising opposing first and second main surfaces, a first power electrode on the first main surface and a second power electrode on the second main surface;
mounting a respective semiconductor die onto the die pad of a respective component position of the leadframe such that the first power electrode is attached to the die pad;
mounting a clip onto the respective semiconductor dies such that the clip is attached to a respective second power electrode;
applying a mold compound and embedding at least side faces of the semiconductor dies and inner surfaces of the leadframe and the clip in the mold compound to form a subassembly; and
cutting through the clip and the leadframe at positions between neighbouring component positions, thereby exposing surfaces of the die pad and the clip that extend substantially perpendicularly to the first main surface of the semiconductor die to form first and second outer contact pads of the semiconductor package,
wherein two subassemblies are formed and an outer surface of the clip of the two subassemblies is embedded in the mold compound and an outer surface of the leadframe of the two subassemblies is exposed from the mold compound.

9. The method of claim 8, wherein the exposed outer surfaces of the leadframes of the two subassemblies are stacked so that the die pads of the leadframes of the two subassemblies are attached to one another and afterwards each clip and the leadframes of the two stacked subassemblies are cut through at positions between neighbouring component positions, thereby exposing surfaces of the die pad and the clip of the two stacked subassemblies to form the first and second outer contact pads.

10. The method of claim 8, wherein the leadframes of the two subassemblies are stacked such that in each component position the die pads of the two subassemblies are electrically connected to one another and the two semiconductor dies are electrically coupled in parallel.

11. The method of claim 8, wherein after cutting through the clip and the leadframe of the two subassemblies at positions between neighbouring component positions and exposing surfaces of the die pad and the clip to form first and second outer contact pads, the exposed outer surfaces of the leadframes of the two subassemblies are stacked so that the die pads of the leadframes of the two subassemblies are attached to one another.

12. The method of claim 11, wherein the leadframes of the two subassemblies are stacked such that in each component position the die pads of the two subassemblies are electrically connected to one another and two semiconductor dies are electrically coupled in parallel.

13. The method of claim 11, wherein the exposed outer surfaces of the leadframes of the two subassemblies are at most partially singulated when stacked.

14. A method for manufacturing a semiconductor package, the method comprising:
providing a leadframe comprising a plurality of component positions, each component position comprising a die pad;
providing a plurality of semiconductor dies, each comprising opposing first and second main surfaces, a first power electrode on the first main surface and a second power electrode on the second main surface;

mounting a respective semiconductor die onto the die pad of a respective component position of the leadframe such that the first power electrode is attached to the die pad;

mounting a clip onto the respective semiconductor dies such that the clip is attached to a respective second power electrode;

applying a mold compound and embedding at least side faces of the semiconductor dies and inner surfaces of the leadframe and the clip in the mold compound to form a subassembly;

cutting through the clip and the leadframe at positions between neighbouring component positions, thereby exposing surfaces of the die pad and the clip that extend substantially perpendicularly to the first main surface of the semiconductor die to form first and second outer contact pads of the semiconductor package, wherein two subassemblies are formed; and stacking the two subassemblies such that an exposed outer surface of the leadframe of a first subassembly is mounted on an exposed outer surface of the leadframe of a second subassembly.

15. The method of claim 14, further comprising attaching and electrically connecting the leadframes of the two subassemblies by an electrically conductive adhesive or solder.

16. A method for manufacturing a semiconductor package, the method comprising:

providing a leadframe comprising a plurality of component positions, each component position comprising a die pad;

providing a plurality of semiconductor dies, each comprising opposing first and second main surfaces, a first power electrode on the first main surface and a second power electrode on the second main surface;

mounting a respective semiconductor die onto the die pad of a respective component position of the leadframe such that the first power electrode is attached to the die pad;

mounting a clip onto the respective semiconductor dies such that the clip is attached to a respective second power electrode;

applying a mold compound and embedding at least side faces of the semiconductor dies and inner surfaces of the leadframe and the clip in the mold compound to form a subassembly;

cutting through the clip and the leadframe at positions between neighbouring component positions, thereby exposing surfaces of the die pad and the clip that extend substantially perpendicularly to the first main surface of the semiconductor die to form first and second outer contact pads of the semiconductor package; and bending distal end of the die pad and the clip away from the semiconductor die to form L-shaped first and second clips.

17. A method for manufacturing a semiconductor package, the method comprising:

providing a leadframe comprising a plurality of component positions, each component position comprising a die pad;

providing a plurality of semiconductor dies, each comprising opposing first and second main surfaces, a first power electrode on the first main surface and a second power electrode on the second main surface;

mounting a respective semiconductor die onto the die pad of a respective component position of the leadframe such that the first power electrode is attached to the die pad;

mounting a clip onto the respective semiconductor dies such that the clip is attached to a respective second power electrode;

applying a mold compound and embedding at least side faces of the semiconductor dies and inner surfaces of the leadframe and the clip in the mold compound to form a subassembly; and cutting through the clip and the leadframe at positions between neighbouring component positions, thereby exposing surfaces of the die pad and the clip that extend substantially perpendicularly to the first main surface of the semiconductor die to form first and second outer contact pads of the semiconductor package, wherein the die pad comprises an inner surface that is attached to the first power electrode of the semiconductor die and an outer surface that opposes the inner surface, wherein a recess is positioned in an edge of the inner surface to space the protruding side face from the first main surface of the semiconductor die, wherein the clip comprises an inner surface that is attached to the second power electrode of the semiconductor die and an outer surface that opposes the inner surface, wherein a recess is positioned in an edge of the inner surface to space a protruding side face from the second main surface of the semiconductor die, wherein at least portions of the recess of the die pad and at least portions of the recess of the clip are embedded in the mold compound.

18. A method for manufacturing a semiconductor package, the method comprising:

providing a leadframe comprising a plurality of component positions, each component position comprising a die pad;

providing a plurality of semiconductor dies, each comprising opposing first and second main surfaces, a first power electrode on the first main surface and a second power electrode on the second main surface;

mounting a respective semiconductor die onto the die pad of a respective component position of the leadframe such that the first power electrode is attached to the die pad;

mounting a clip onto the respective semiconductor dies such that the clip is attached to a respective second power electrode;

applying a mold compound and embedding at least side faces of the semiconductor dies and inner surfaces of the leadframe and the clip in the mold compound to form a subassembly;

cutting through the clip and the leadframe at positions between neighbouring component positions, thereby exposing surfaces of the die pad and the clip that extend substantially perpendicularly to the first main surface of the semiconductor die to form first and second outer contact pads of the semiconductor package; and removing the mold compound from an outer surface of the clip or a strip or a further leadframe including a plurality of clips.

19. A method for manufacturing a semiconductor package, the method comprising:

providing a leadframe comprising a plurality of component positions, each component position comprising a die pad;

providing a plurality of semiconductor dies, each comprising opposing first and second main surfaces, a first power electrode on the first main surface and a second power electrode on the second main surface;

mounting a respective semiconductor die onto the die pad of a respective component position of the leadframe such that the first power electrode is attached to the die pad;

mounting a clip onto the respective semiconductor dies such that the clip is attached to a respective second power electrode;

applying a mold compound and embedding at least side faces of the semiconductor dies and inner surfaces of the leadframe and the clip in the mold compound to form a subassembly; and cutting through the clip and the leadframe at positions between neighbouring component positions, thereby exposing surfaces of the die pad and the clip that extend substantially perpendicularly to the first main surface of the semiconductor die to form first and second outer contact pads of the semiconductor package, wherein the cutting produces a cut that extends through the mold compound positioned on each clip, through any connecting regions which extend between adjacent clips, and through the mold compound which is positioned between the semiconductor dies in neighbouring component positions, wherein the cut partially singulates the leadframe such that the component positions of the subassembly remain held together by a remaining portion of the leadframe.

* * * * *